(12) United States Patent
Blanchard

(10) Patent No.: US 8,704,301 B2
(45) Date of Patent: Apr. 22, 2014

(54) DEVICES, METHODS, AND SYSTEMS WITH MOS-GATED TRENCH-TO-TRENCH LATERAL CURRENT FLOW

(71) Applicant: Fairchild Semiconductor Corporation, San Jose, CA (US)

(72) Inventor: Richard A. Blanchard, Los Altos, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 13/710,006

(22) Filed: Dec. 10, 2012

(65) Prior Publication Data

US 2013/0119467 A1    May 16, 2013

Related U.S. Application Data

(63) Continuation of application No. 12/755,658, filed on Apr. 7, 2010, now Pat. No. 8,330,217, which is a continuation of application No. 11/852,959, filed on Sep. 10, 2007, now Pat. No. 7,705,397.

(60) Provisional application No. 60/825,059, filed on Sep. 8, 2006.

(51) Int. Cl.
*H01L 27/108* (2006.01)
*H01L 29/78* (2006.01)

(52) U.S. Cl.
USPC .......... 257/335; 257/336; 257/337; 257/343; 257/E29.256

(58) Field of Classification Search
USPC ............... 257/335–336, E29.256, E21.418
See application file for complete search history.

(56) References Cited

U.S. PATENT DOCUMENTS

| 5,640,034 | A | 6/1997 | Malhi |
|---|---|---|---|
| 5,689,128 | A | 11/1997 | Hshieh et al. |
| 6,812,526 | B2 | 11/2004 | Blanchard |
| 7,705,397 | B2 | 4/2010 | Blanchard |
| 8,330,217 | B2 | 12/2012 | Blanchard |
| 2003/0157756 | A1 | 8/2003 | Beasom |
| 2005/0095789 | A1 | 5/2005 | Blanchard |

(Continued)

FOREIGN PATENT DOCUMENTS

| WO | WO-00052760 A1 | 9/2000 |
|---|---|---|
| WO | WO-03038863 A2 | 5/2003 |

OTHER PUBLICATIONS

"U.S. Appl. No. 11/852,959, Non Final Office Action mailed Feb. 20, 2009", 10 pgs.

(Continued)

*Primary Examiner* — Mamadou Diallo
(74) *Attorney, Agent, or Firm* — Schwegman, Lundberg & Woessner, P.A.

(57) ABSTRACT

A DMOS transistor is fabricated with its source/body/deep body regions formed on the walls of a first set of trenches, and its drain regions formed on the walls of a different set of trenches. A gate region that is formed in a yet another set of trenches can be biased to allow carriers to flow from the source to the drain. Lateral current low from source/body regions on trench walls increases the active channel perimeter to a value well above the amount that would be present if the device was fabricated on just the surface of the wafer. Masking is avoided while open trenches are present. A transistor with a very low on-resistance per unit area is obtained.

18 Claims, 35 Drawing Sheets

(56) References Cited

U.S. PATENT DOCUMENTS

| | | |
|---|---|---|
| 2006/0286751 A1 | 12/2006 | Urakami et al. |
| 2008/0067584 A1 | 3/2008 | Lui |
| 2008/0073707 A1 | 3/2008 | Darwish |
| 2008/0087956 A1 | 4/2008 | Blanchard |
| 2010/0194467 A1 | 8/2010 | Blanchard |

OTHER PUBLICATIONS

"U.S. Appl. No. 11/852,959, Notice of Allowance mailed Dec. 11, 2009", 7 pgs.

"U.S. Appl. No. 11/852,959, Preliminary Amendment filed Dec. 26, 2007", 6 pgs.

"U.S. Appl. No. 11/852,959, Response filed Aug. 20, 2009 to Non Final Office Action mailed Feb. 20, 2009", 9 pgs.

"U.S. Appl. No. 12/755,658, Notice of Allowance mailed Aug. 8, 2012", 9 pgs.

"U.S. Appl. No. 12/755,658, Preliminary Amendment filed Apr. 7, 2010", 1 pg.

"U.S. Appl. No. 12/755,658, Response filed Apr. 11, 2012 to Restriction Requirement mailed Sep. 1, 2010", 6 pgs.

"U.S. Appl. No. 12/755,658, Restriction Requirement mailed Sep. 1, 2010", 5 pgs.

Horizontal Cross Section at BB'

Horizontal Cross Section at BB´

Horizontal Cross Section at BB'

Table 1. Possible trench etch combinations.

| Number of Trench Etches | Number of Trenches Etched Simultaneously | Trench Etch Order | | |
|---|---|---|---|---|
| | | Source/Body | Gate | Drain |
| 3 | 1 | 1st | 2nd | 3rd |
| 3 | 1 | 1st | 3rd | 2nd |
| 3 | 1 | 2nd | 1st | 3rd |
| 3 | 1 | 2nd | 3rd | 1st |
| 3 | 1 | 3rd | 1st | 2nd |
| 3 | 1 | 3rd | 2nd | 1st |
| 2 | 2 | 1st | 1st | 2nd |
| 2 | 2 | 2nd | 2nd | 1st |
| 2 | 2 | 1st | 2nd | 1st |
| 2 | 2 | 2nd | 1st | 1st |
| 2 | 2 | 2nd | 1st | 2nd |
| 2 | 2 | 1st | 2nd | 2nd |
| 1 | 3 | 1st | 1st | 1st |

*FIG. 12A*

Table 2. 3D Trench Combinations

| Figure | Gate Trench | Source/Body Trench | Drain Trench |
|---|---|---|---|
| 7a | Separate | Continuous | Continuous |
| 7b | Separate | Separate | Continuous |
| 7c | Separate | Continuous | Separate |
| 7d | Continuous | Separate | Separate |
| 7e | Separate | Separate | Separate |

FIG. 12B

DEVICES, METHODS, AND SYSTEMS WITH MOS-GATED TRENCH-TO-TRENCH LATERAL CURRENT FLOW

CROSS-REFERENCE TO OTHER APPLICATION

This application is a continuation of and claims the benefit of priority under 35 U.S.C. §120 to U.S. patent application Ser. No. 12/755,658, filed on Apr. 7, 2010, which is a continuation of and claims the benefit of priority under 35 U.S.C. §120 to U.S. patent application Ser. No. 11/852,959, filed on Sep. 10, 2007, which issued as U.S. Pat. No. 7,705,397 on Apr. 27, 2010, which claims the benefit of priority under 35 U.S.C. §119(e) to U.S. Provisional Patent Application Ser. No. 60/825,059, filed on Sep. 8, 2006, the benefit of priority of each of which is claimed hereby, and each of which are incorporated by reference herein in its entirety.

BACKGROUND

The present application relates to double-diffused MOS or "DMOS" power devices, and particularly to DMOS transistors which provide lateral carrier flow between their source/body regions and their drain regions, all of which have been formed along the walls of trenches that have been etched into the surface of a semiconductor wafer.

Note that the points discussed below may reflect the hindsight gained from the disclosed inventions, and are not necessarily admitted to be prior art.

DMOS transistors have become the dominant transistor type for solid-state power switching at voltages below about 500 volts. One innovation that has led to this dominance was the development of the trench MOSFET described in U.S. Pat. Nos. 4,767,722 and 5,034,785, both hereby incorporated by reference. Trench DMOS transistors or "TrenchFETs" operate in much the same fashion as conventional lateral or conventional vertical DMOS transistors. In a basic n-channel DMOS transistor, a heavily doped source region is separated from the drain region by a relatively narrow p-type body region. The source region is usually formed by introducing n-type dopant atoms along the same edge that was earlier used to introduce the p-type body dopant atoms. A gate region, which is most often doped polycrystalline silicon ("polysilicon"), is capacitively coupled to the body region. A sufficiently positive voltage on the gate with respect to the source inverts the normally p-type surface of the body region, thereby forming an n-type "channel" which allows n-type carriers (carrier electrons) to flow from the source region to the drain region of the device. The drain electrode may be formed on the same surface as the source/body electrode, or it may be formed on the opposite surface of the wafer.

Manufacturers of MOS-gated devices such as DMOS transistors have used a variety of methods to reduce the specific on-resistance of their products. The specific on-resistance, which is the product of the on-resistance of a device multiplied by its surface area, is one figure of merit often used as a basis for comparing device performance. The device with the lowest specific on-resistance for a given voltage has the most efficient use of surface area. The main device structures that have been used to manufacture commercially available DMOS transistors include lateral DMOS, vertical DMOS, and trench DMOS, all of which are shown in FIGS. 2A-2C respectively.

A fourth type of DMOS transistor, known as a "Super 3D MOSFET," has been proposed for further reducing device size, particularly for devices operating at relatively low voltages. See J. Sakakibara, N. Suzuki, and H. Yamaguchi, "Break-through of the Si limit under 300V breakdown voltage with new concept power device: Super 3D MOSFET," ISPSD, 2002, pp. 233-236; and H. Yamaguchi, Y. Urakami and J. Sakakibara, "Break-through of on-resistance Si limit by Super 3D MOSFET under 100V breakdown voltage," Proceedings of the 18th International Symposium on Power Semiconductor Devices and ICs (ISPSD) Jun. 4-8, 2006. Both of these articles are hereby incorporated by reference.

A drawing of the Super 3D MOSFET is shown in FIG. 2D. Note that the predominant direction of current flow is lateral: carriers travel in an approximately horizontal plane. Thus a single horizontal slice through the device would include an operative DMOS transistor. The downwardly extended device can be thought of as a number of such operative transistors, downwardly stacked to give a very large total channel cross-section. While the concept of the Super 3D MOSFET is an extension of a trench MOSFET to three dimensions, the sequence of semiconductor processing steps that can be used for their manufacture is difficult to optimize.

SUMMARY

The present application discloses new approaches to downwardly extended transistor structures, to methods of fabricating and using them, to transistor arrays which include many such transistor structures, and to systems including such transistor structures.

In one class of embodiments, the structure and operation of downwardly extended lateral transistors is improved by laterally diffusing a "deep body" region, in proximity to a lateral source region, which improves the ruggedness and voltage withstand characteristics of the device.

In another class of embodiments, fabrication of such devices is improved by filling all open trenches, at least temporarily, when patterning steps are performed. To accomplish this result, such intermediate trench-filling is preferably optimized, in various ways, by using dopant source and/or conductor depositions at stages in the process where such trench filling is desired. This combination of functions in individual steps provides synergistic benefits.

In some classes of embodiments, trenches of different types, in fabrication of a downwardly extended multi-trench device, are etched simultaneously.

As discussed below, these classes of embodiments may be combined synergistically, or alternatively less than all of the disclosed teachings can be used.

The disclosed innovations, in various embodiments, provide one or more of at least the following advantages:
  Better power efficiency.
  Simpler design of low-power circuits and systems (since on-resistance in switching devices becomes less of a factor).
  Compact systems which are able to operate at automotive voltages.
  Reduced thermal burden on solid-state switching devices.
  Less ohmic loss.
  Simpler fabrication.
  Improved breakdown voltage.
  Breakdown currents are diverted around the channel region.
  Less likelihood of damage to the device when breakdown occurs.
  Reduced size for a given voltage and current rating.
  Reduced cost (for a given voltage and current rating).
  Improved performance at voltages below 300V.
  Systems which can operate longer, and/or with more functionality, from a severely limited total energy supply.

Systems which can operate longer, and/or with more functionality, from a severely limited power budget.

Systems with greater portability.

Longer operating lifetime for battery-powered systems, especially under high-reliability specifications.

Reduced weight in battery-powered systems, for a given operating specification and rated operating lifetime.

Reduced need to physically access battery-powered systems in inaccessible locations for battery replacement.

Note that not all of these advantages are necessarily present in every embodiment. Also, this Summary and advantages do NOT limit the Claims of this application.

BRIEF DESCRIPTION OF THE DRAWINGS

The disclosed inventions will be described with reference to the accompanying drawings, which show important sample embodiments of the invention and which are incorporated in the specification hereof by reference, wherein:

FIGS. 12A and 12B are two tables which are used to illustrate the advantages of preferred geometric options.

DETAILED DESCRIPTION

Figure 1A:
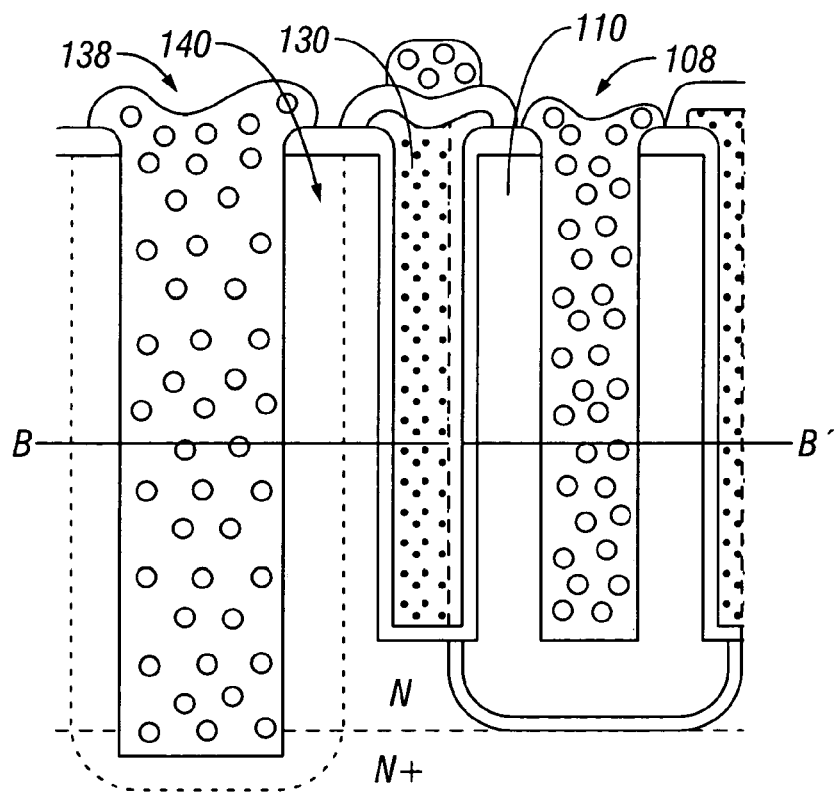
FIGS. 1A, 1B, and 1C schematically show a vertical section view of a portion of a sample device, along with horizontal slice views of the carrier densities of that device in the OFF and ON states.

The numerous innovative teachings of the present application will be described with particular reference to presently preferred embodiments (by way of example, and not of limitation).

The present application describes several sequences of process steps that can be used to fabricate Super 3D DMOS transistors. One goal of each of these process sequences is to perform the photomasking steps only when there are no unfilled trenches present, thereby avoiding any problems that might be caused by using conventional photoresist on surfaces having such trenches. Fabrication sequences are discussed, that have one, two, or three separate trench etch steps. In addition, details of the process steps that allow both the source and the body to be contacted in each source/body trench are described in detail.

The structure of a Super 3D DMOS transistor included three trenches, one each for the source/body, the gate, and the drain. The etching of each of these three trenches is a major process step, so it is advantageous to etch more than one trench at a time. Given that three trenches need to be etched, the possibilities for combined etching are shown in the table of FIG. 12A.

Looking closely at these possible combinations, the first six require three separate trench etch steps. Each set of trenches can be separately etched, oxidized (if required), doped (if required), and filled independently of the two other trenches. In these six possible fabrication sequences, the only requirement is that the trenches be capable of performing the required function. The independent nature of the three types of trenches allows these three trench formation steps to be performed in any order.

When the goal is to etch two of the sets of trenches simultaneously and the third set of trenches at a third time, there are also six possible fabrication sequences. However, the choice of whether the trench etch step (or steps) is performed first or second is generally not important, so while there are six possible combinations, there are only three rows shown in. Table 1. All of these trench etch combinations can be used to fabricate Super 3D DMOS transistors with the specific process blocks shown in this invention disclosure.

The basic fabrication sequence of a Super 3D DMOS transistor according to one embodiment of this invention is shown in FIGS. 3A-3J. Note that this sequence is merely an illustrative, though preferred, example. This sample fabrication sequence include the following processing steps. (Minor steps, such as cleanups etc., are omitted.)

Steps 0-4: If both the source/body terminal and the drain terminal are to be on the front surface of the wafer, either an n-type substrate or a lightly doped p-type substrate may be used, without needing an epitaxial layer. If the drain terminal is to be on the opposite surface from the source/body terminal, an epitaxial layer of either n-type silicon or lightly doped p-type silicon is required. The epitaxial layer should be formed on a heavily doped, low resistivity n-type wafer. In the process sequence shown in FIGS. 3A-3J, an n-type epitaxial wafer on a heavily doped n-type substrate is used. The steps of forming the dielectric layer (or dielectric sandwich) are not shown, but it is formed before the gate trenches are etched.

Steps 5-6: The trenches for the source/body and the trenches for the drain are etched. The source/body trenches are narrower than the drain trenches and there are also protrusions on both sides of the trenches. Having the source/body trenches narrower than the drain trenches means that the source/body trenches are completely filled by the p-doped layer as shown in the accompanying figure, while the drain trenches are not filled. The protrusions produce a p-type body region that is closer to the heavily doped drain in selected locations, which determine where reverse breakdown occurs. In addition, the presence of the protrusions allows their vertical surfaces to remain being doped p-type while the walls of the main trenches are doped n-type. (The details of this unexpected result are shown in FIGS. 4A-4F, and are discussed later in the text.)

Step 7: Using an isotropic etch process, the p-doped layer is removed from all of the surfaces except the source/body trenches without the use of a mask. The narrower width of the source/body trenches results in these trenches being completely filled. Therefore, the isotropic etch process etches the p-doped layer from everywhere except the source/body trenches.

Step 8: The drain trenches are etched deeper allowing contact to the underlying low resistivity, n-type material, which allows the drain terminal (or other terminal) to be formed on the back of the wafer. (The step of deepening these trenches could be performed elsewhere in the fabrication sequence. However, performing the etch step now allows all of the surfaces of the drain trenches to be doped heavily with n-type dopant at step 12, when the source regions are also doped.)

Steps 9-10: Perform a high temperature step to diffuse the p-type dopant that is in the deposited layer into the walls of the source/body trenches. Next, remove the layer containing the p-type dopant from the walls of the source/body trenches, except for the material in the protrusions. (Specific steps that can be followed to obtain this result are discussed in greater detail in the portion of the text associated with FIGS. 4A-4F.)

Steps 11-12: Deposit an n-doped layer so that it completely fills the source/body trenches and the drain trenches. Perform a high temperature step to diffuse the n-type dopant that is in the deposited film into the exposed walls of the source/body trenches and into all of the walls of the drain trenches. The surfaces of the protrusions are protected, so no n-type doping occurs there.

Step 13: Leaving the n-doped layer in place, mask and etch the surface of the wafer to form contacts to the poly silicon gates. (Since the surface of the wafer is relatively flat, conventional masking can be used.)

Step 14 shows a substantially complete device. Of course other subsequent steps can be added for additional interconnect, passivation, other components, and/or topside bonding.

In the sequence of FIGS. 3A-3J, which has two trench etch steps, the gate trenches are etched before the source/body and the drain trenches are etched. However, it is possible to reverse the order and form the source/body and the drain trenches first, followed by the formation of the gate trenches.

FIGS. 4A-4F show details of a set of alternative process steps, which allows both the source region and the body region to be contacted along the walls of the trenches.

FIGS. 11A-F show details of a set of alternative process steps, which allows both the source region and the body region to be contacted along the walls of the trenches.

FIGS. 5A-5D show a variation of the process sequence of FIGS. 3A-3J without a drain conductor layer on the top surface of the device Access to the drain terminal is on the back of the wafer and a wafer with an epitaxial layer is needed. If the process sequence of FIGS. 3A-3J is used, the source/body, the gate, and the drain conductors are all present on the top surface of the wafer, and an epitaxial wafer is not required. However, the presence of all three terminals on one wafer surface may complicate device layout and also decrease device density. If all three terminals are on the top surface, "Step 8" of the FIGS. 3A-3J flow can be eliminated.

Figure 3A:
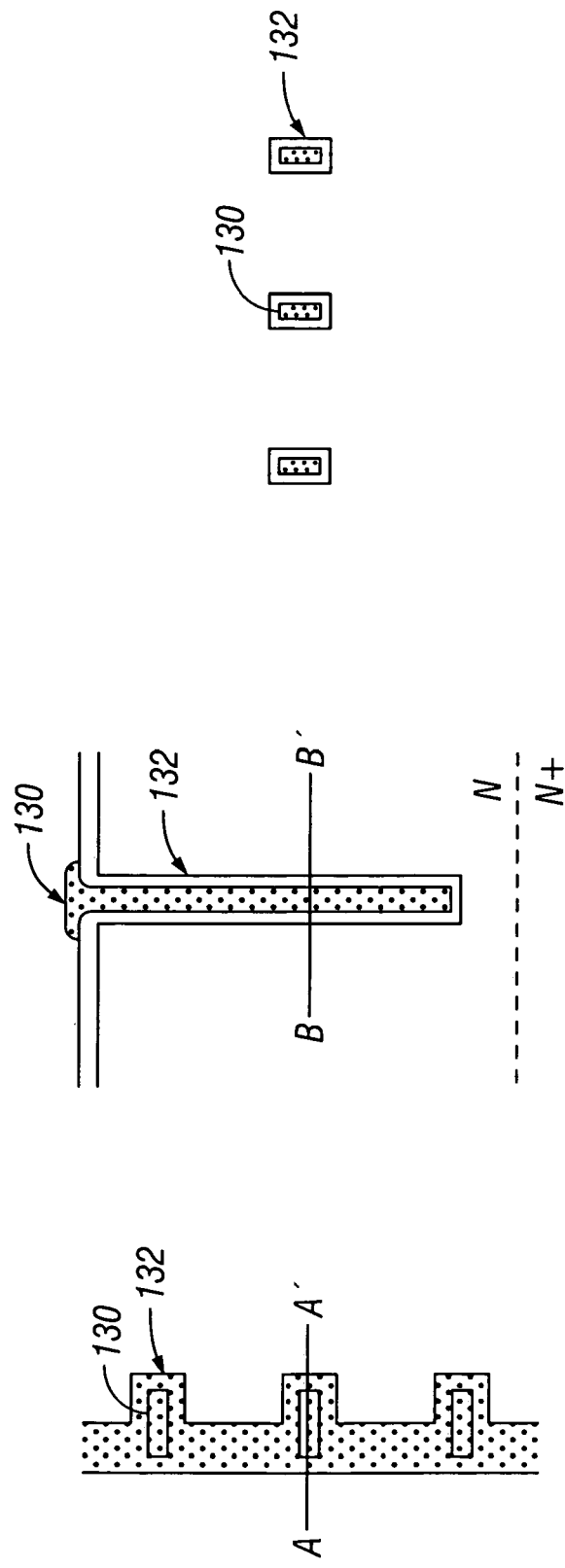
FIGS. 3A-3J show a sequence of process steps in a sample preferred embodiment.
Figure 3B:
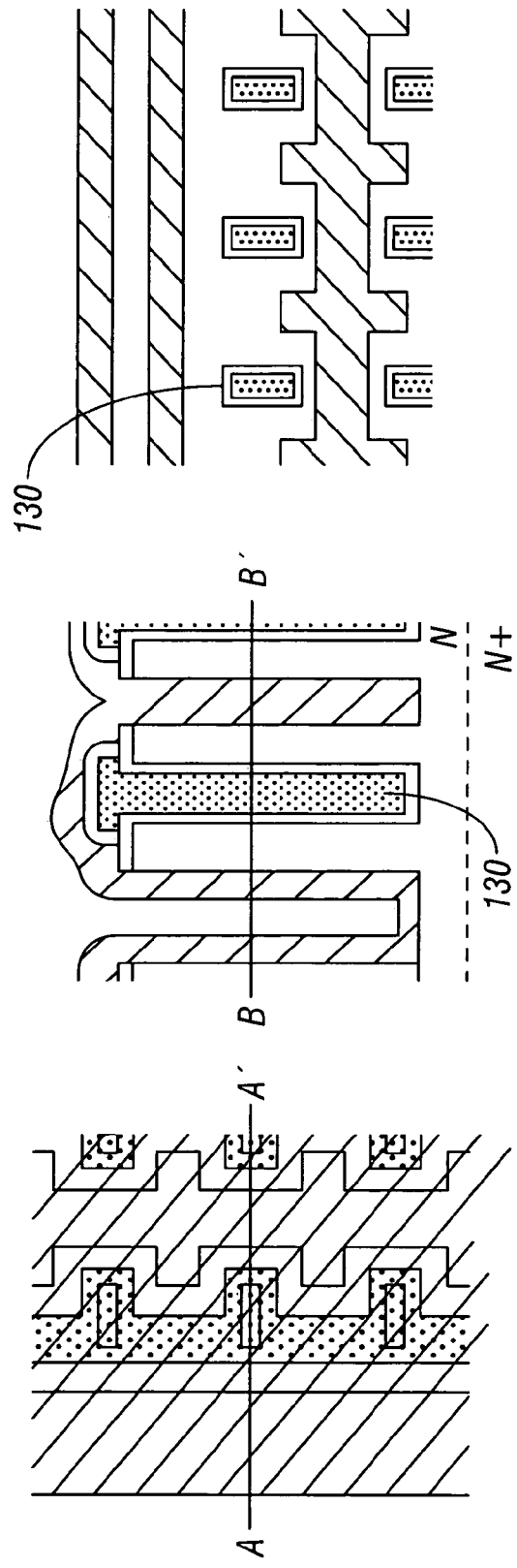
Figure 3C:
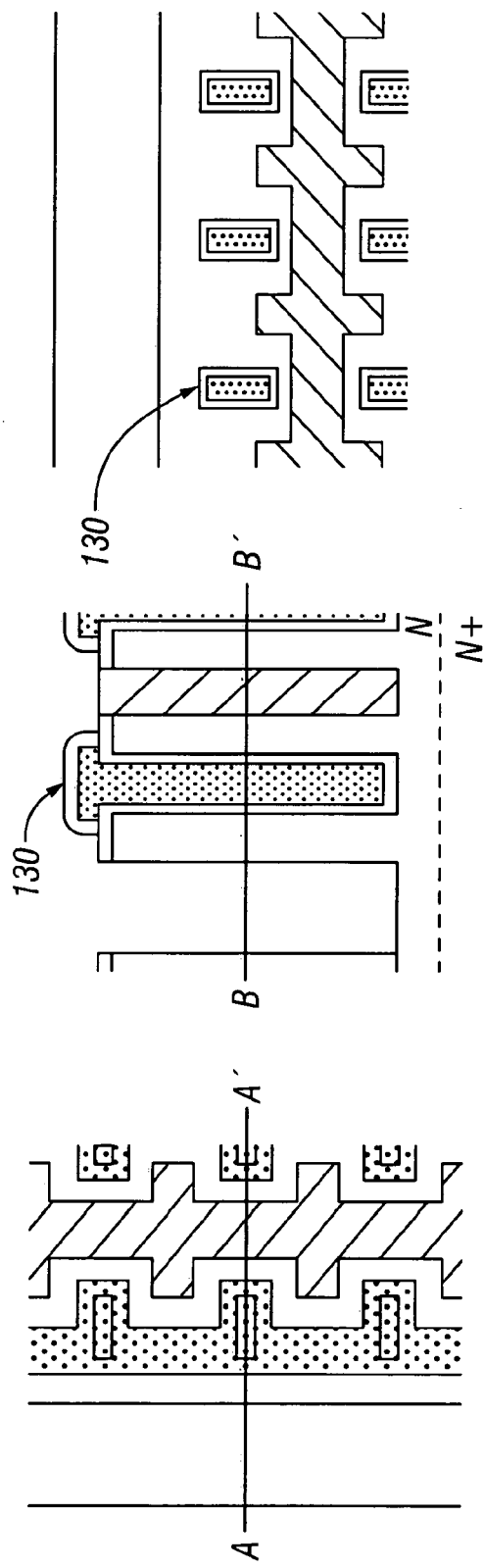
Figure 3D:
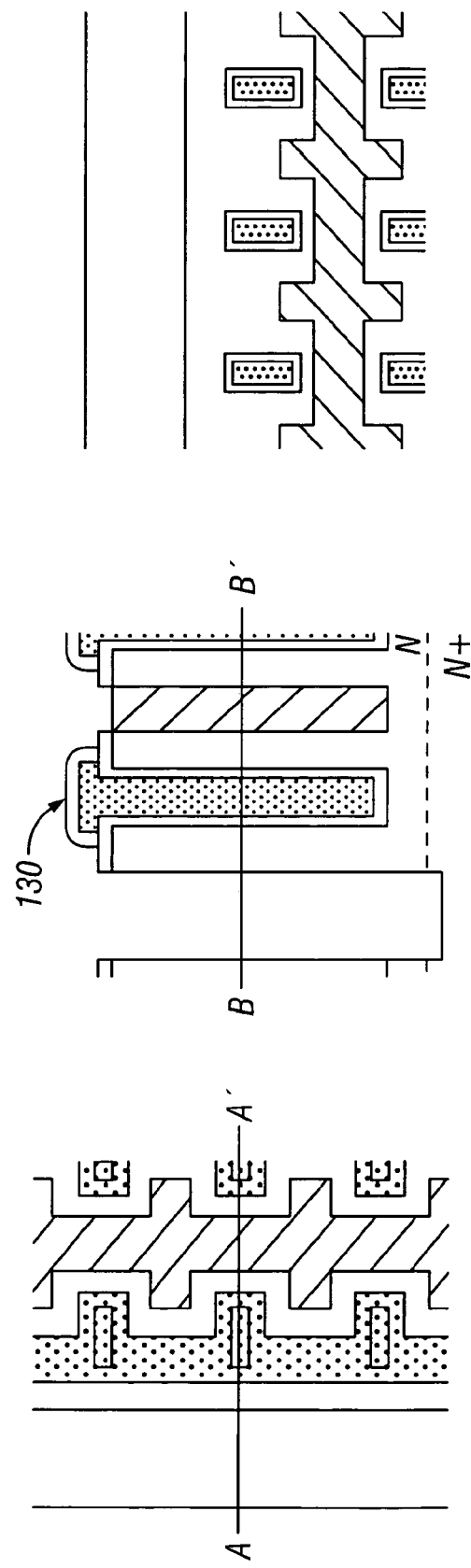
Figure 3E:
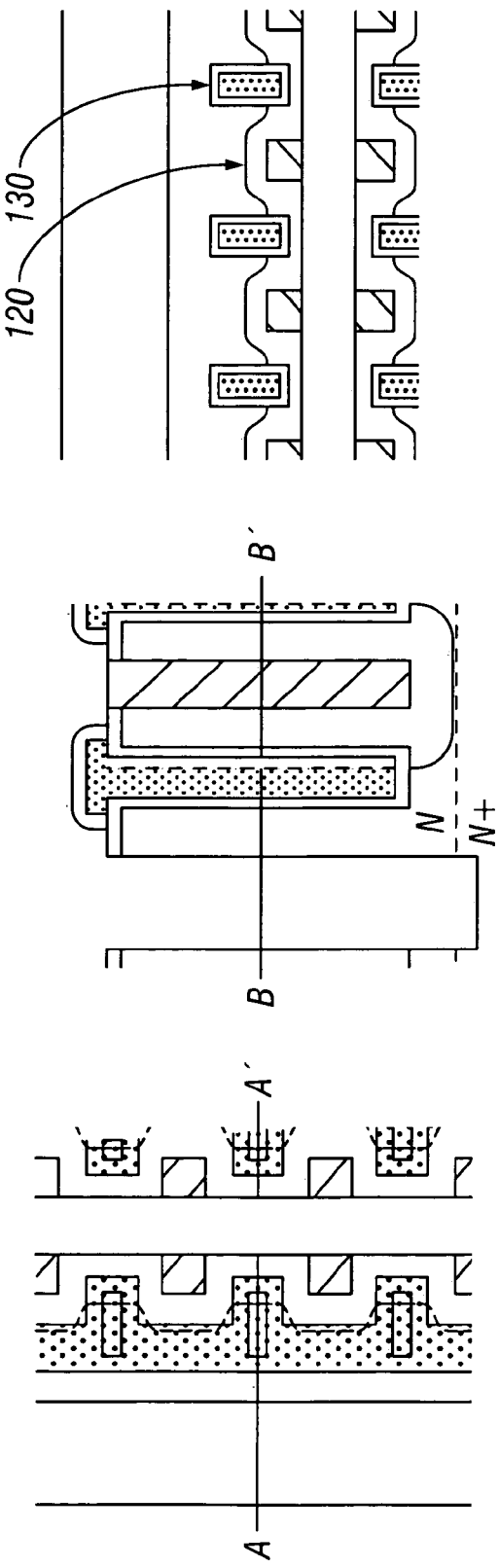
Figure 3F:
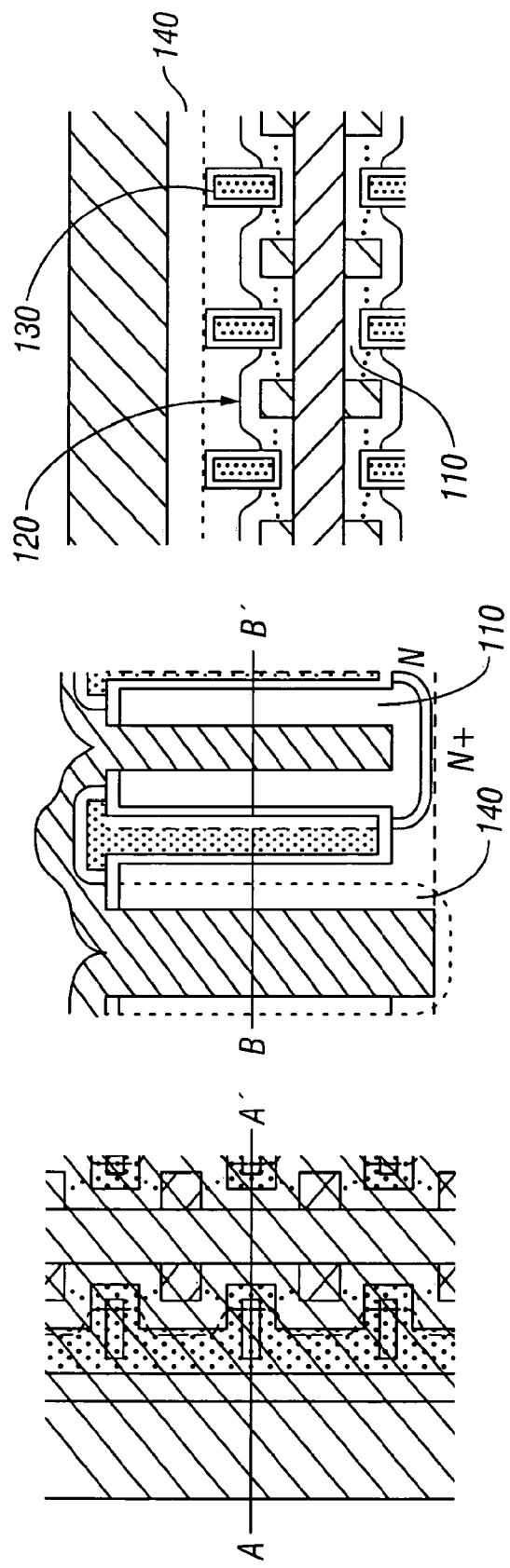
Figure 3G:
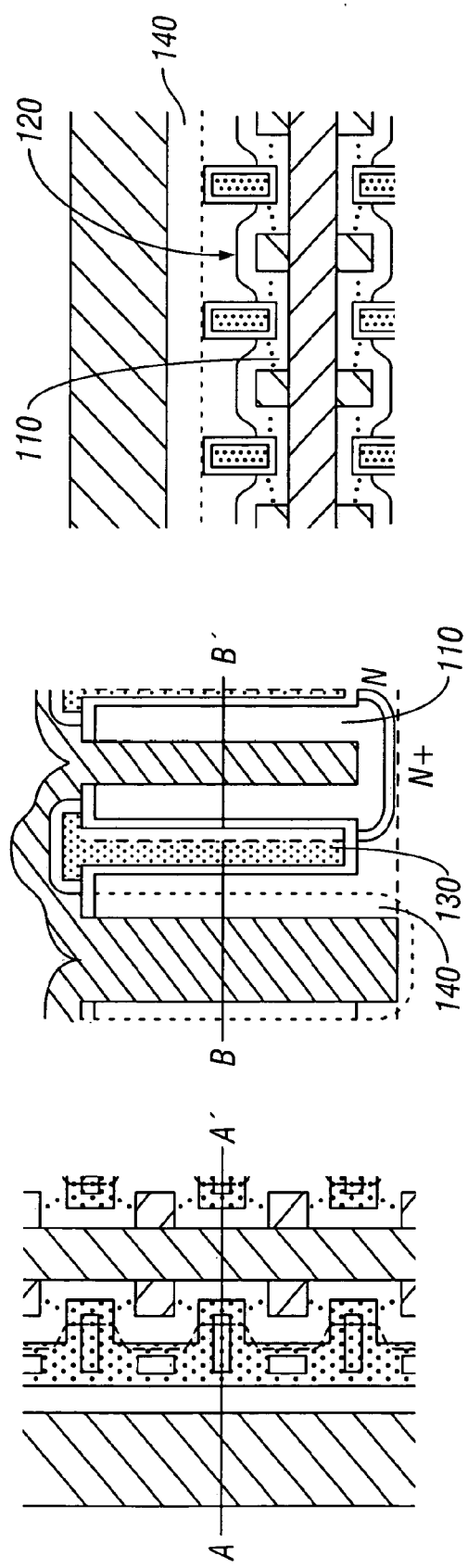
Figure 3H:
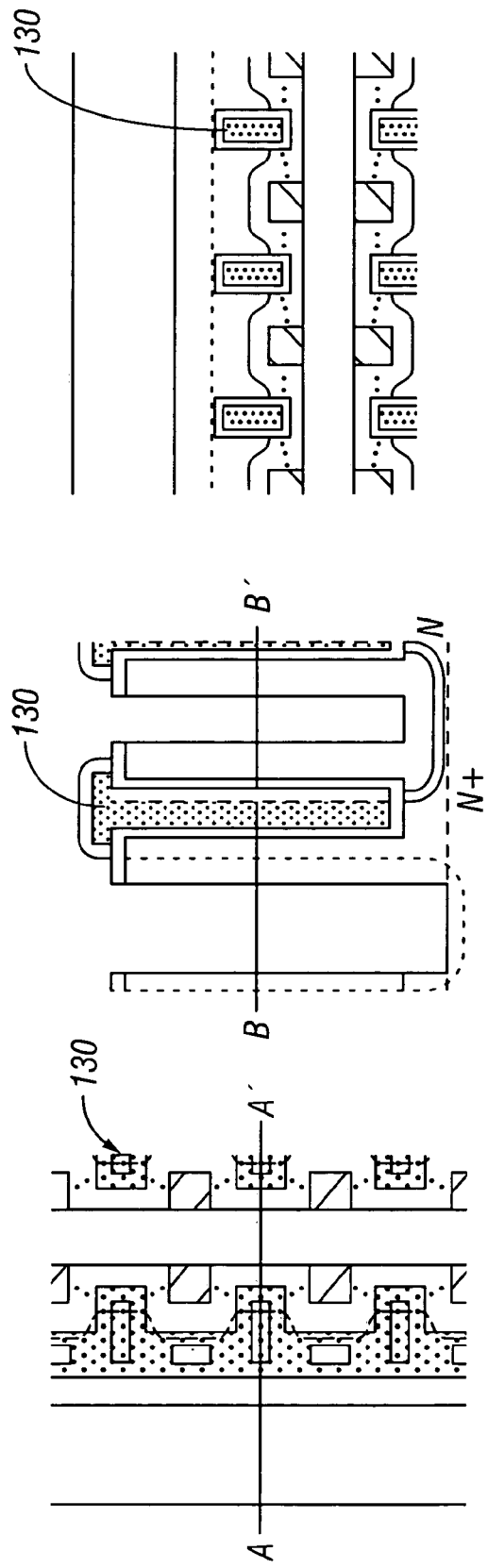
Figure 3I:
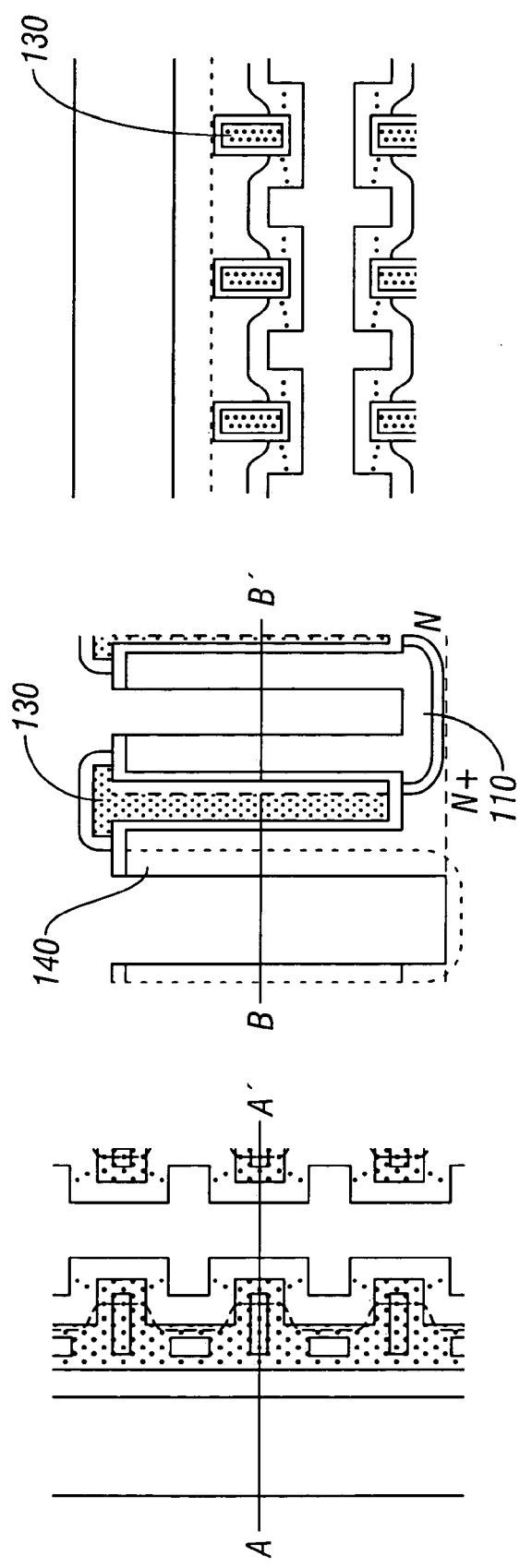
Figure 3J:
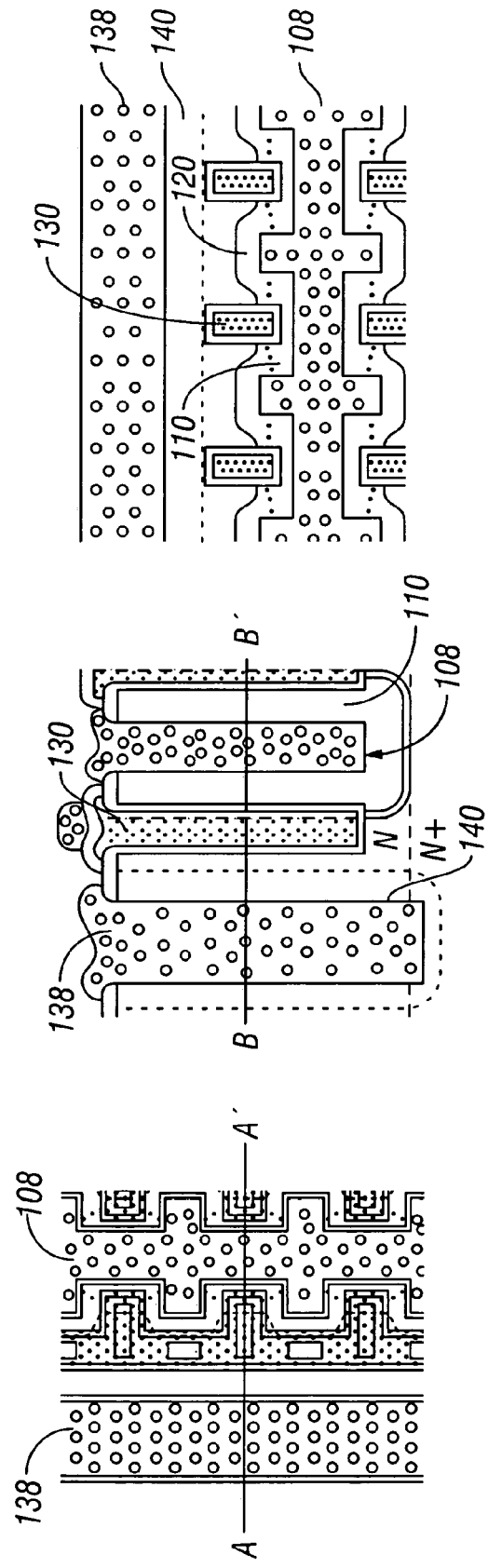
Figure 4A:
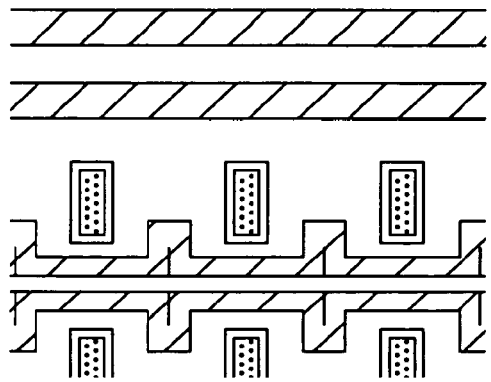
FIGS. 4A-4F show a sequence of alternative process steps which can be used to modify the sequence of FIGS. 3A-3J.
Figure 4B:
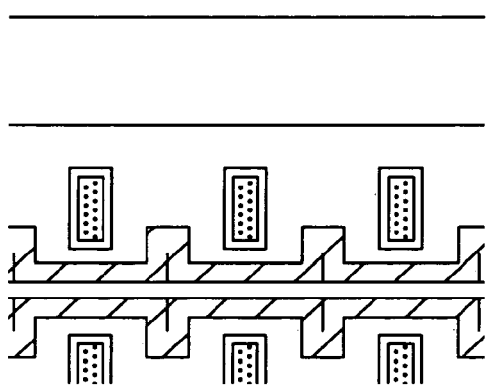
Figure 4C:
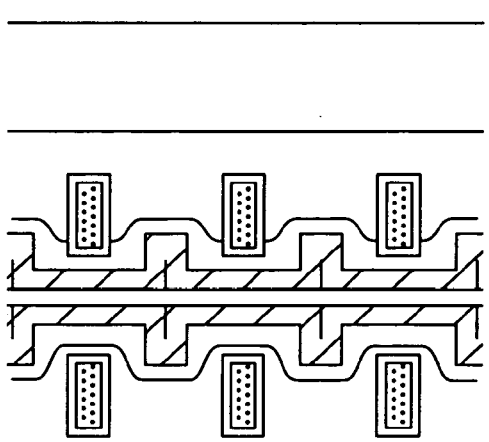
Figure 4D:
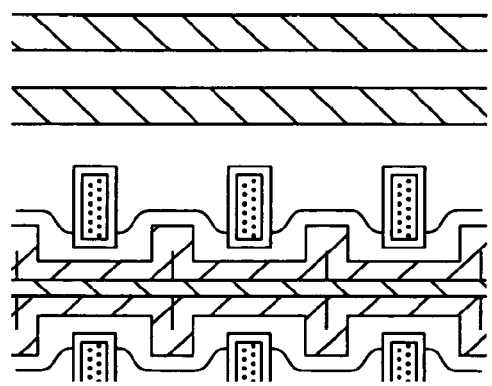
Figure 4E:
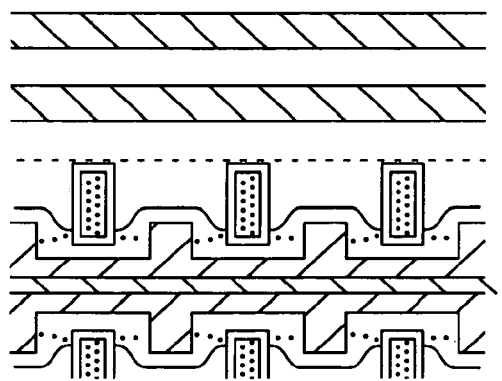
Figure 4F:
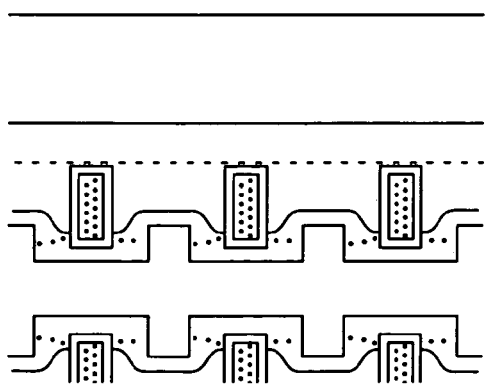
Figure 5A:
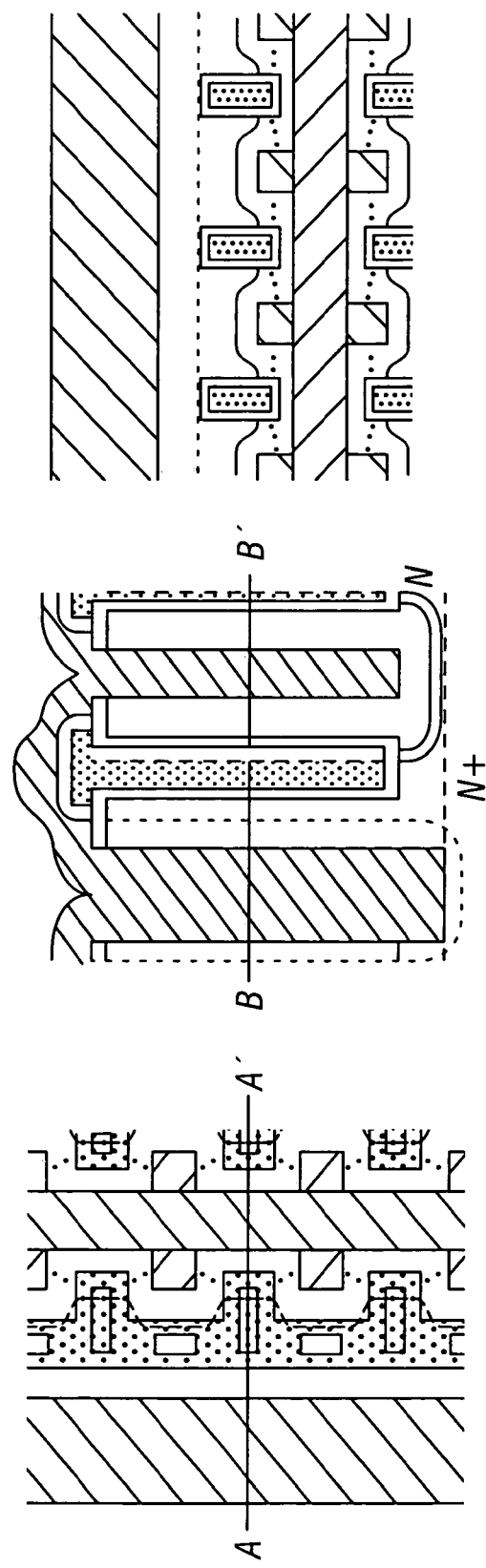
FIGS. 5A-5D show another sequence of alternative process steps which can be used to modify the sequence of FIGS. 3A-3J or others.
Figure 5B:
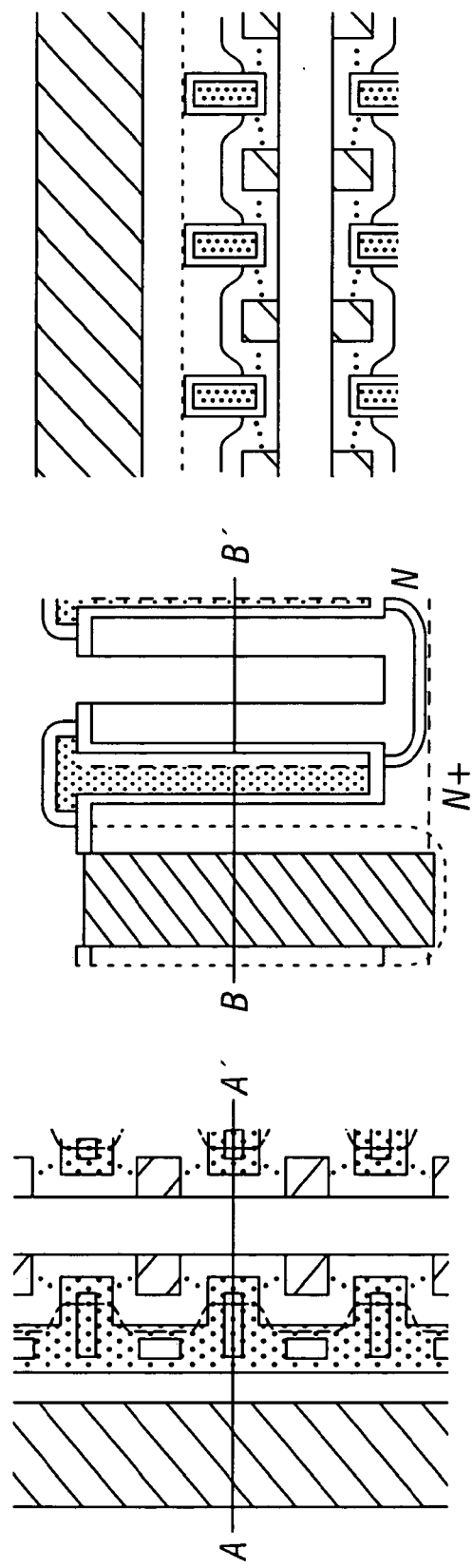
Figure 5C:
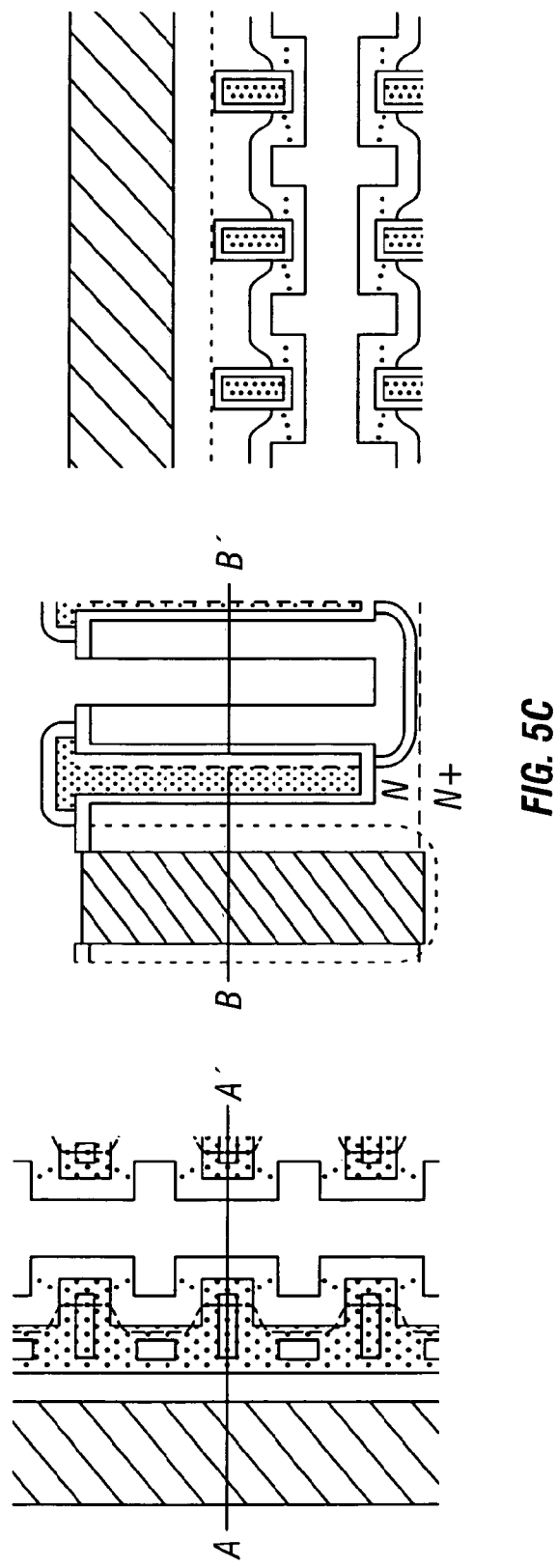
Figure 5D:
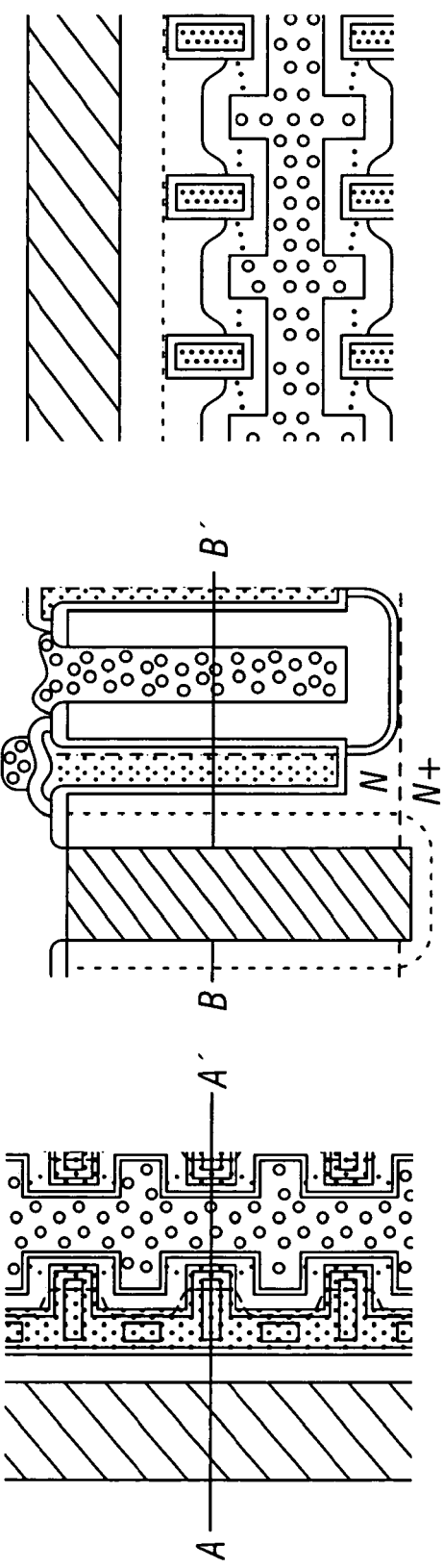
Figure 6A:
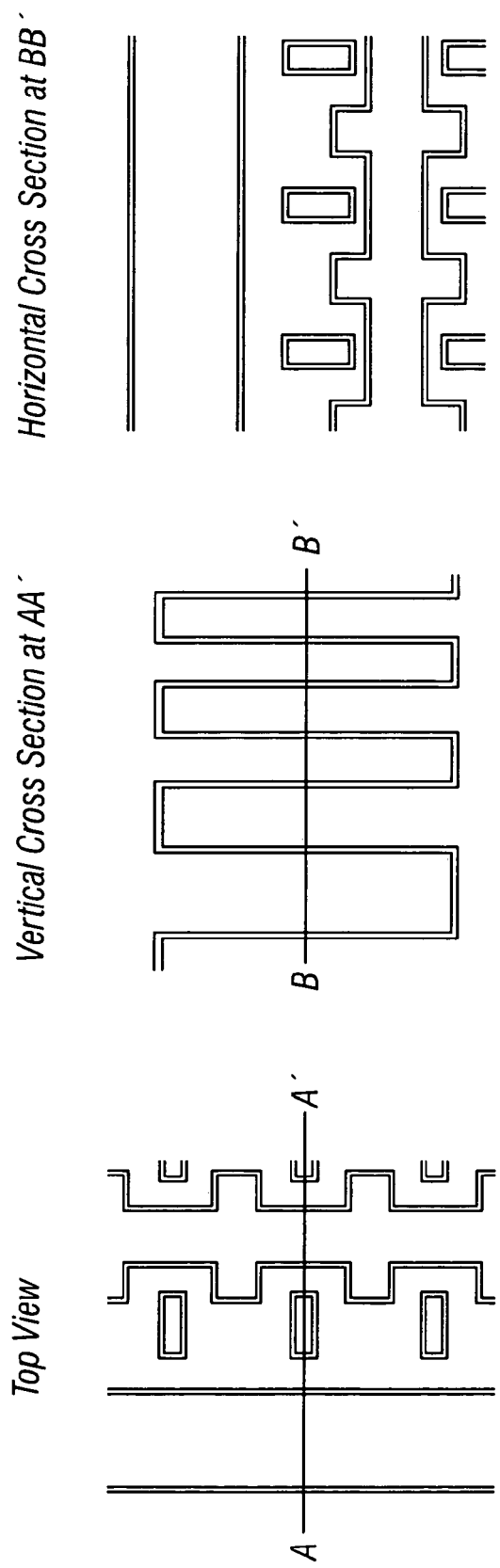
FIGS. 6A-6D show a sequence of alternative process steps which can be used to modify the sequence of FIGS. 3A-3J or others.
Figure 6B:
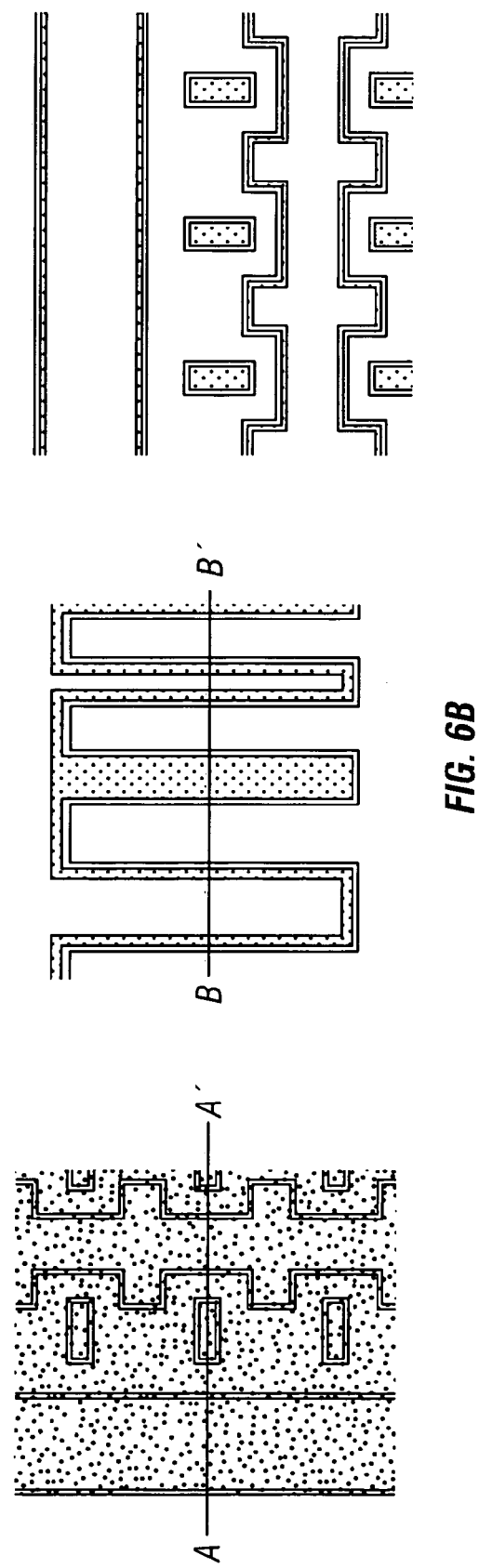
Figure 6C:
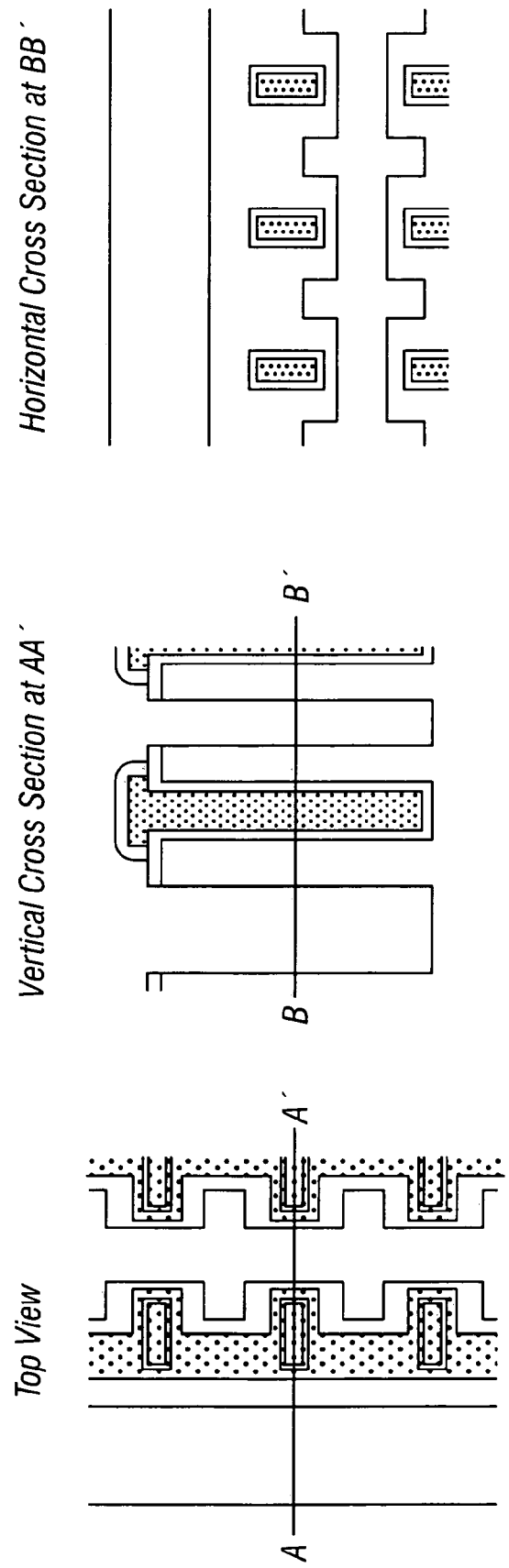
Figure 6D:
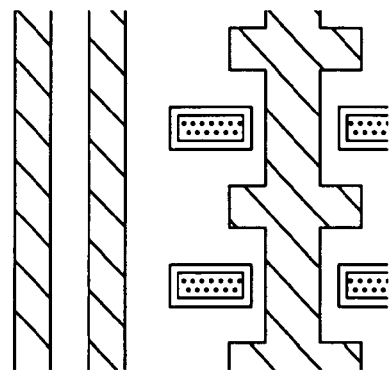
Figure 6D:
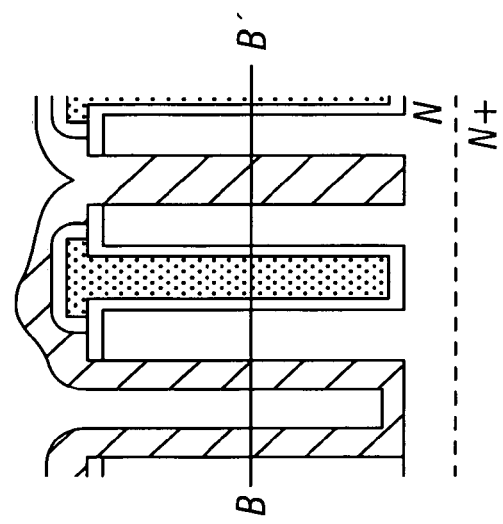
Figure 6D:
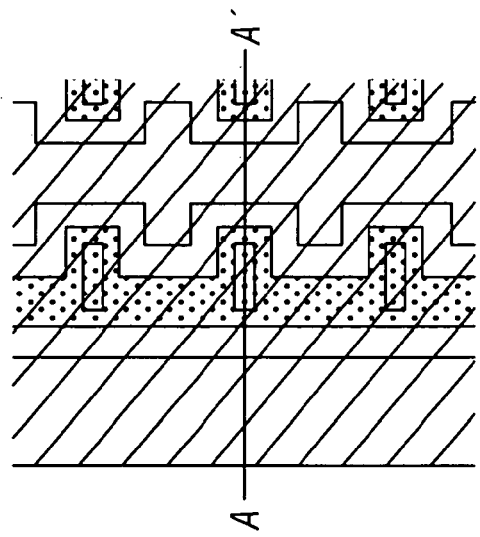
Figure 7A:
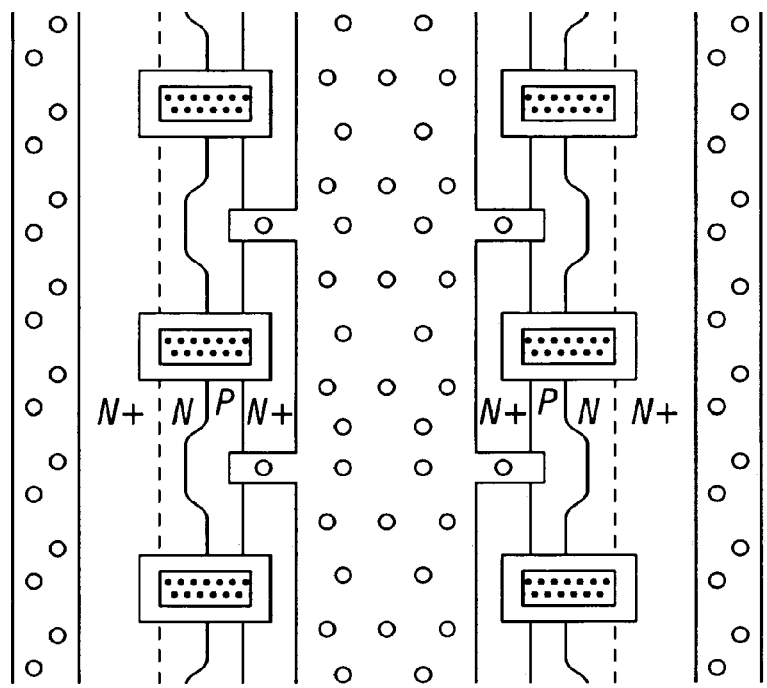
FIGS. 7A-7E show alternative geometries for alternative layouts with various differing advantages.
Figure 7B:
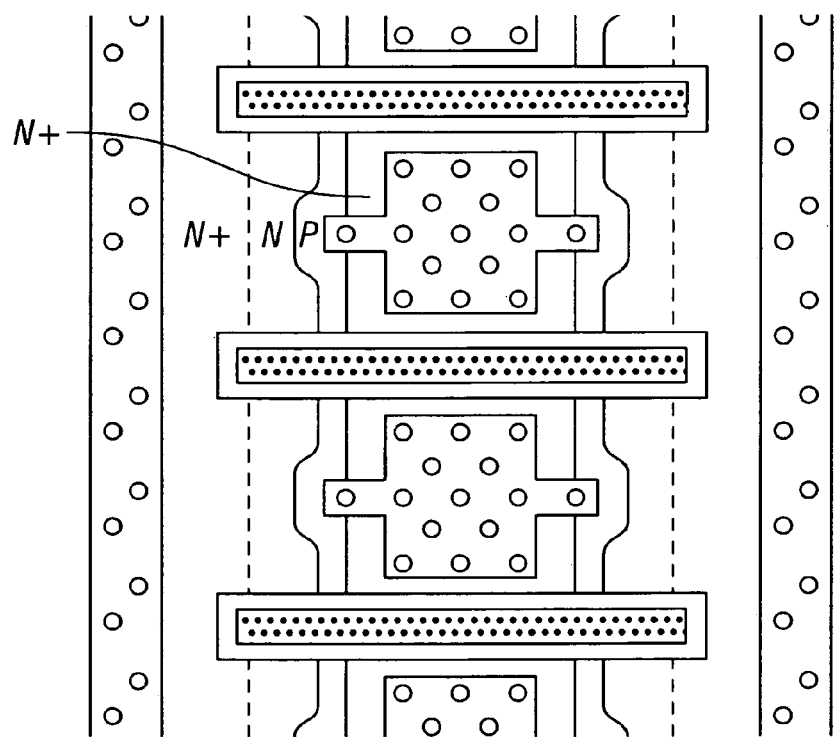
Figure 7C:
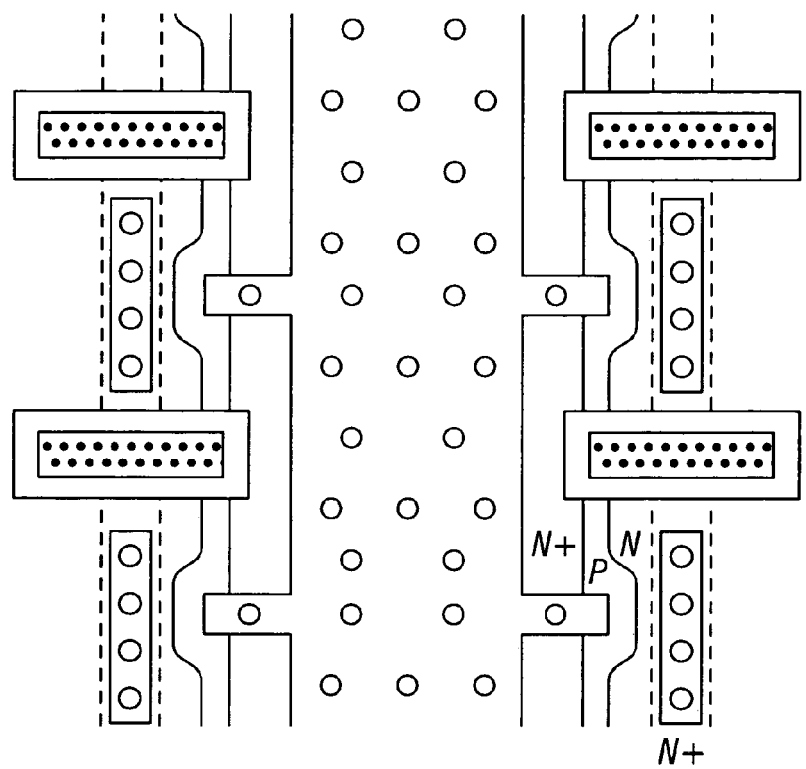
Figure 7D:
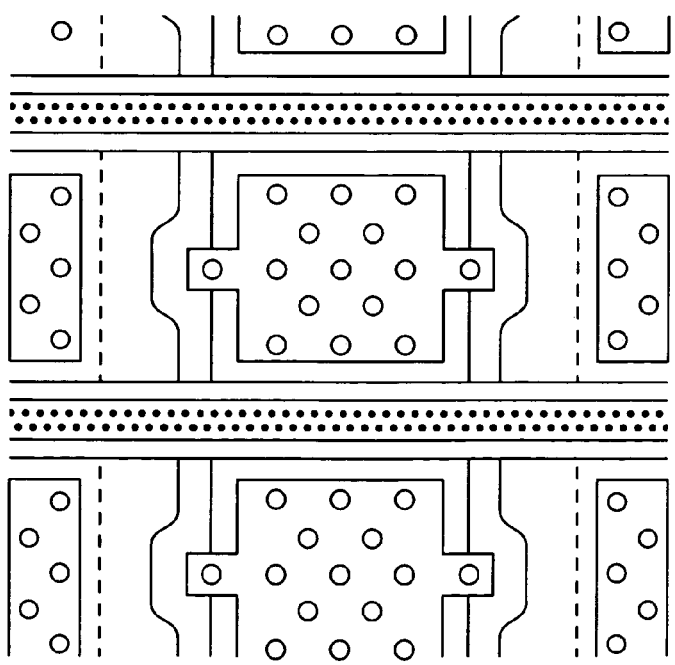
Figure 7E:
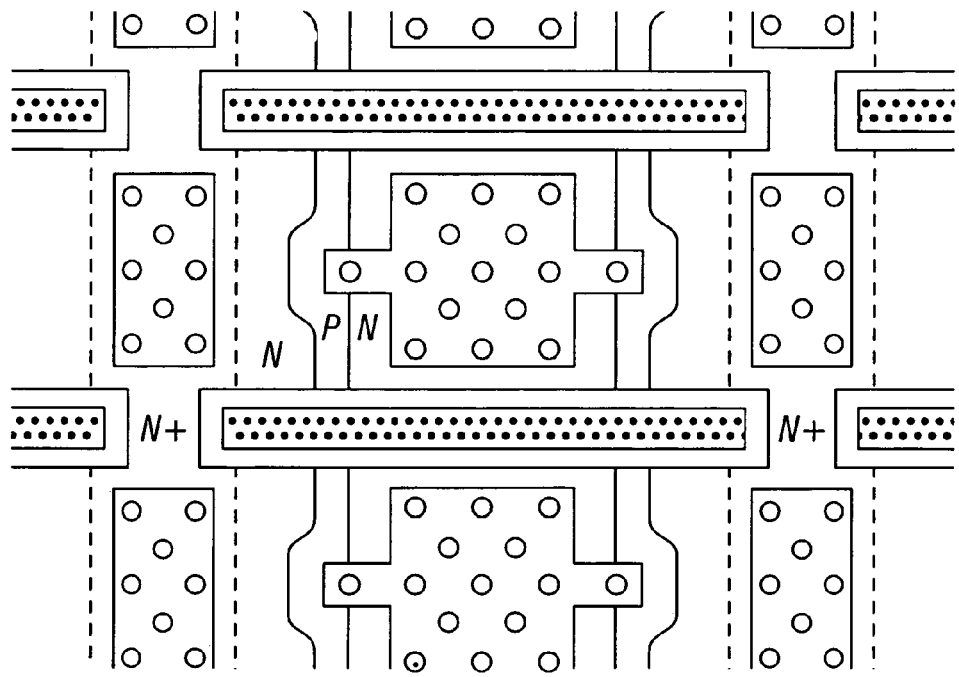

In the process sequences of both FIGS. 3A etc. and FIG. 5A etc., the source/body trenches and the drain trenches are etched simultaneously. It is also possible to etch each of these two sets of trenches at different steps, but such process sequences add one more deep trench etch step to the process flow. Referring to FIGS. 3A-J, "Step 5" would be changed to reflect the etching of only the source/body trenches, while "Step 8" would be the point at which the drain trench etch step is added. With three sets of trenches, various combinations of trenches, with various etch sequences may be used as discussed earlier, and as shown in FIG. 12A.

The number of trench etch steps used can optionally be reduced from two to one by simultaneously etching the gate, the source/body, and the drain trenches. A partial process sequence that has simultaneously etched source/body, gate, and drain trenches replaces Steps 1-5 of FIGS. 3A-3J with the steps shown in FIGS. 6A-6D. This process sequence of FIGS. 6A-6D allows the poly and the gate oxide to remain in the gate trenches while being removed from the source/body and drain trenches. The gate oxide layer and the poly silicon layer and an additional sacrificial layer combine to fill the gate trenches, so conventional masking techniques may be used to mask the poly in the gate trenches. (It is also possible to remove the poly from the source/body and the drain trenches using only an etch, but in this instance, the poly remains only in the trenches, and contact to the gates may be more difficult than if poly is on the top surface). Following step 5, steps 6-16 of the process sequence shown in FIGS. 3A-3J are performed.

The conductor layer that is deposited at "Step 16" of both FIGS. 3A-3J and FIGS. 5A-5D can be a metal, a silicide, doped poly silicon, or a sandwich of materials such as both doped poly and a metal, in the trenches, and a metal that contacts the conductive layer in the trench on the surface.

The device geometry shown in FIGS. 3A-3J is one of a number of possible geometries. Various trench combinations are shown in FIGS. 7A-7E. The source/body, the gate and the drain trenches may be physically separated or may be continuous as shown in the Table of FIG. 12B, entitled "3D Trench Combinations."

Figure 8A:
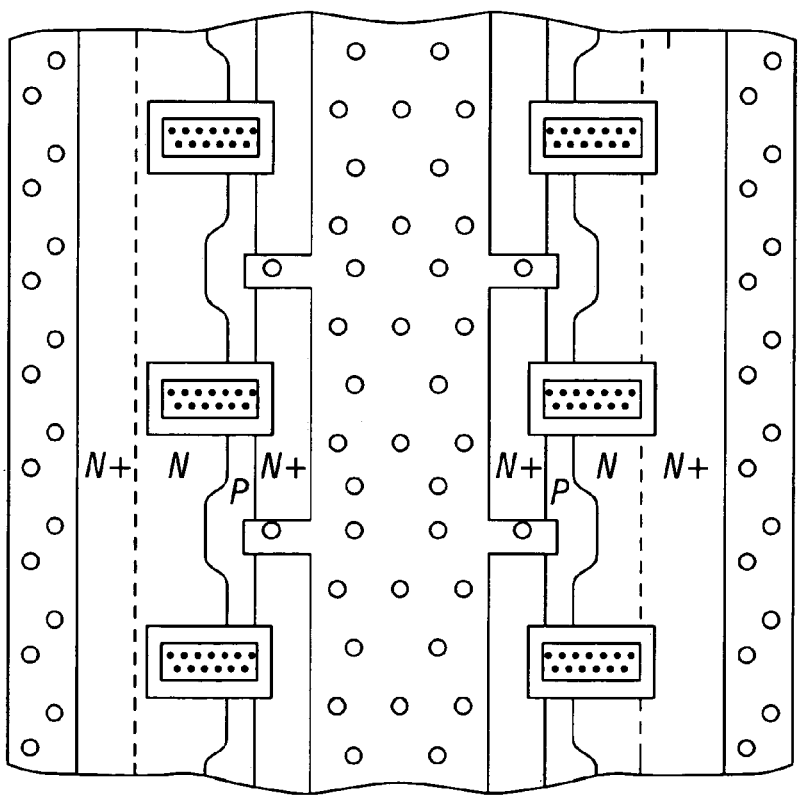
FIGS. 8A, 8B, 8C show how device geometries can be adjusted for different voltage ranges.

It is possible to increase the breakdown voltage of the Super 3D MOSFET by increasing the distance between the gate and the N+ drain region. This variation is shown in FIGS. 8A and 8C for Super 3D DMOS transistors having continuous drain structures, and in FIG. 8B for Super 3D DMOS transistors having separate drain structures.

Figure 9A:
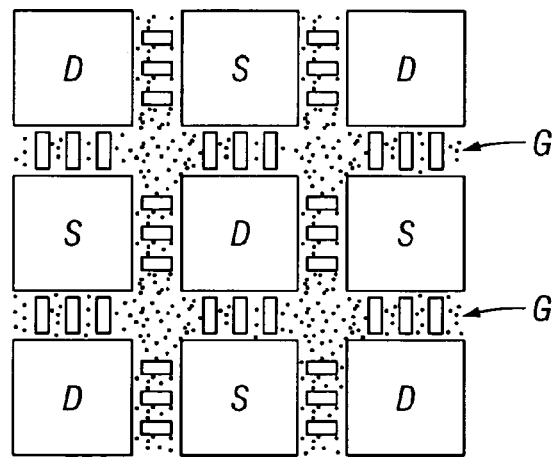
FIGS. 9A, 9B, 9C, 10A, 10B, and 10C show a wide variety of transistor array geometries.
Figure 9B:
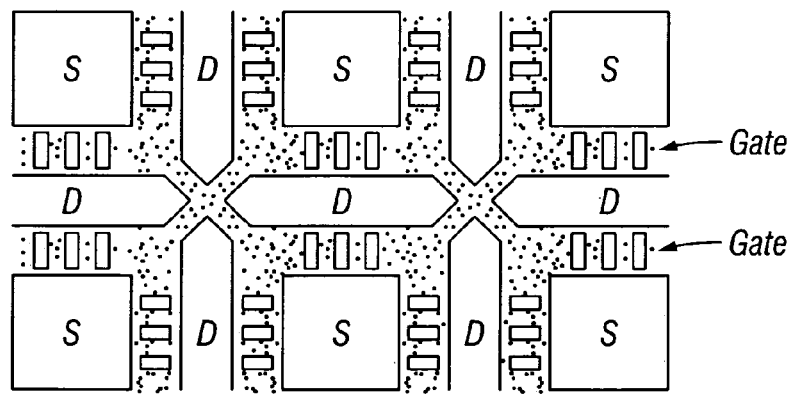
Figure 9C:
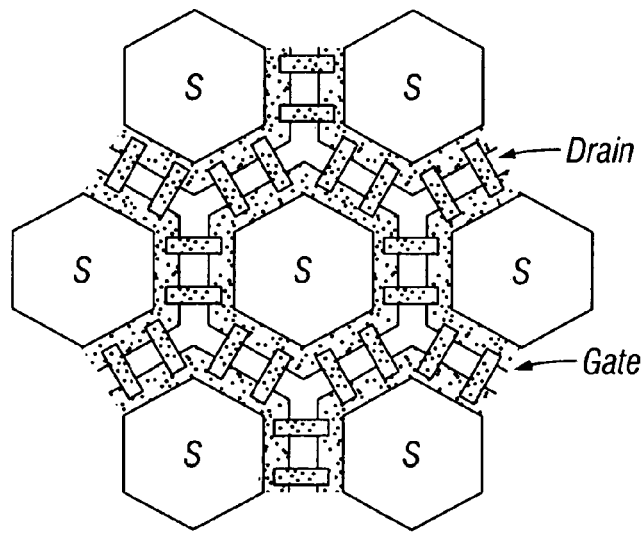
Figure 10A:
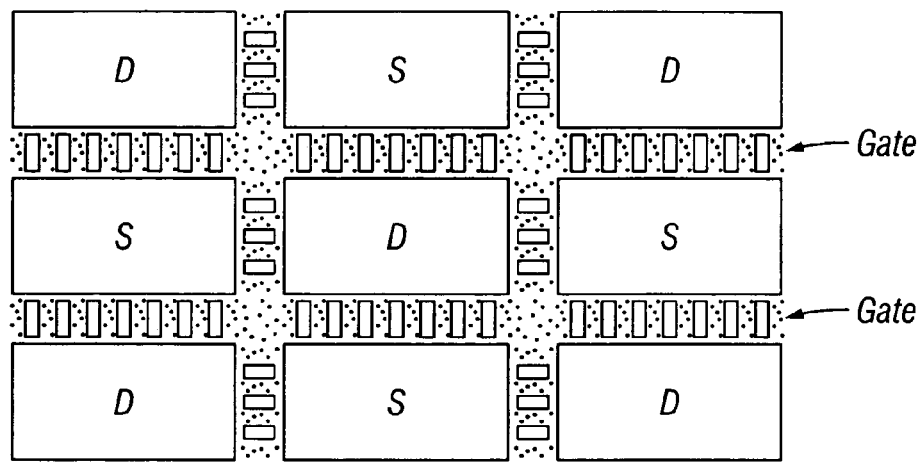
Figure 10B:
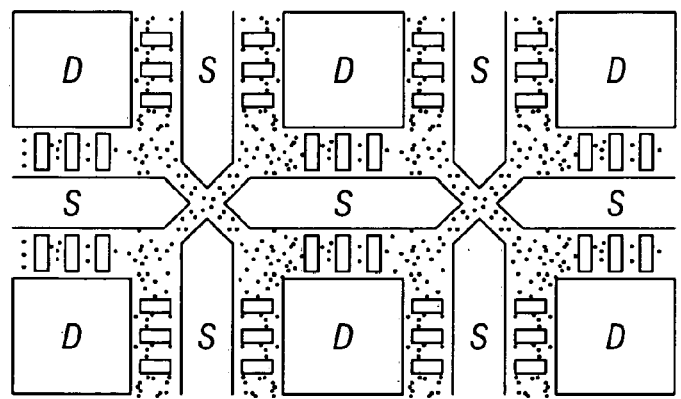
Figure 10C:
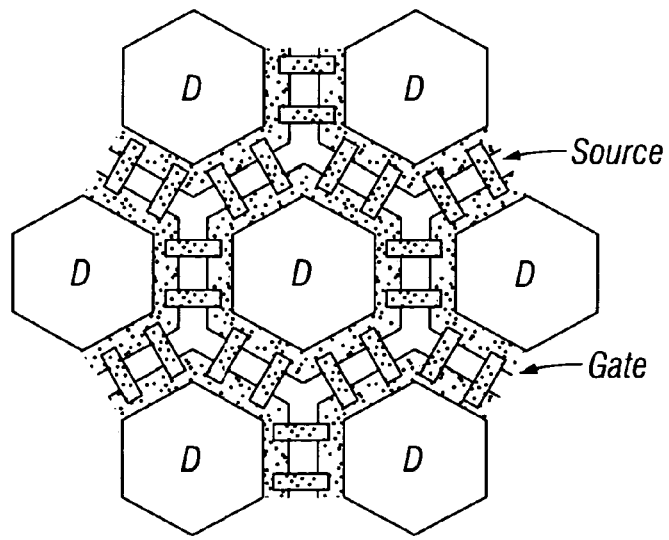
Figure 11A:
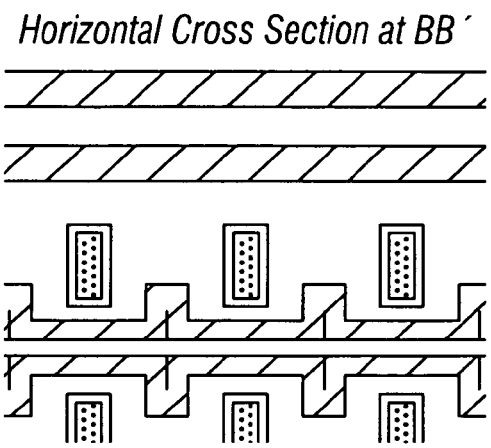
FIGS. 11A-11F show a sequence of alternative process steps which can be used to modify the sequence of FIGS. 3A-3J or others.
Figure 11B:
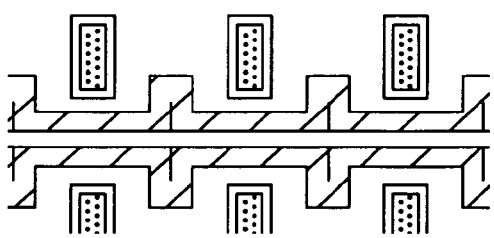
Figure 11C:
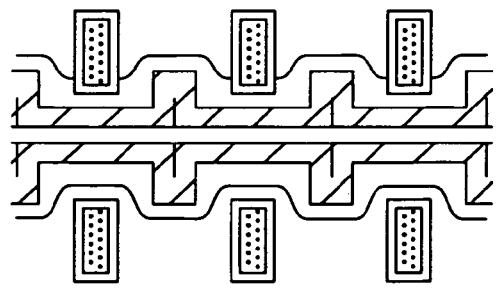
Figure 11D:
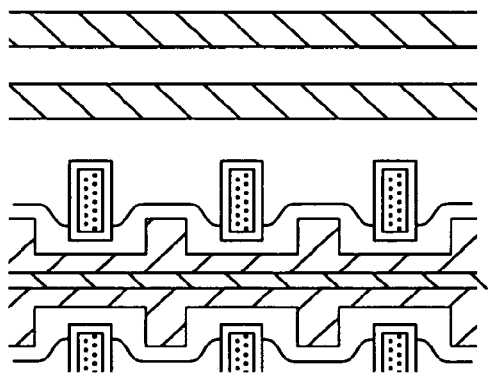
Figure 11E:
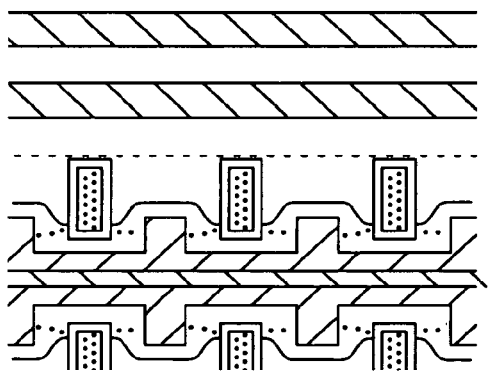
Figure 11F:
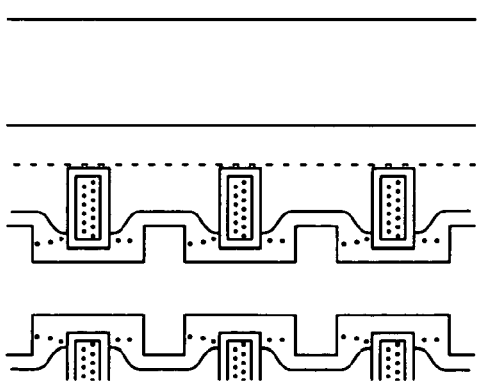

Other geometries in addition to the interdigitated geometries shown in. FIGS. 3A-8C can be used for Super 3D DMOS transistors. A top view of three such geometries is shown in FIGS. 9A-C, and others are shown in FIGS. 10A-10C. The square geometry of FIG. 9A can be modified to produce a rectangular geometry as shown in FIG. 10A, while the locations of the source and drain regions can be reversed in FIGS. 9B and 9C can be interchanged to produce the geometries shown in FIG. 10B and FIG. 10C. Other geometrical shapes such as circles, triangles, octagons, etc. can be substituted for the geometries shown in FIGS. 9 and 10 with no change in device functionality.

The successful fabrication of Super 3D DMOS transistors is complicated by a number of problems, including the ones listed below, that must be solved.

1. The source, body, gate, and drain regions must all be defined by trench walls.
2. Both doping profile of the body region and the doping profile of the source region must be precisely controlled to produce a DMOS transistor with a predetermined threshold voltage and breakdown voltage.
3. The body diffusion should include deep body regions that direct any high current that flows through the body region (for instance, in reverse breakdown) around the sensitive channel region to prevent unwanted damage at the surface of the channel.

The specific techniques used to solve these four problems are described after the general process flow is discussed. Other fabrication details such as etching trenches for the source/body, the gate, and the drain regions, and forming electrical contacts to each of these three regions have largely been solved, and are incorporated into the fabrication sequences without a detailed discussion.

FIGS. 3A-3J show a sample process sequence for fabricating the Super 3D DMOS transistor. Each figure in this sequence shows three views: The leftmost column shows a Top View of the structure at each stage, the middle view shows a Vertical Cross Section at AA', and the rightmost column shows a Horizontal Cross Section at BB'.

Initially (step 0), the starting material is an N/N+ or n-type substrate. The gate trenches, a gate oxide is formed, and doped polysilicon is deposited. This forms the gates 130 and the gate oxides 132. (See FIG. 3A.)

Step 1. Mask and etch poly.

Step 2. Etch trenches for the source/body regions and for the drain regions. (Note that the source/body trenches are narrower than the drain trenches.)

Step 3. Deposit a P-doped layer (oxide, poly, silicon, etc.) to fill the source/body trenches, but not the drain trenches. (This filling relationship is achieved by picking the correct deposition thickness, as is very well known to process engineers.) (See FIG. 3B.)

Step 4. Etch the P-doped layer non-selectively, leaving it only in the source/body trenches. (See FIG. 3C.)

Step 5. Further etch the drain trench until it reaches the N+ substrate (if present). (See FIG. 3D.)

Step 6. Dope the body region by performing a p-type diffusion. This forms the first part of a deep body diffusion 120, as well as the shallow body diffusion which will be self-aligned to the source diffusion. (See FIG. 3E.)

Step 7. Etch the P-doped layer, leaving it only in the "notches" in the source/body trench.

Step 8. Deposit an N-doped layer (oxide, poly, silicon, etc.) in both the source/body and the drain trench.

Step 9. Dope the source and drain regions by performing an n-type diffusion. This forms source diffusion 110 and drain diffusion 140. Since the p-type dopant source is still present in the notches of the source/body trench, further p-type doping can outdiffuse at this time to enhance the deep body diffusions 120. Note that, since the source diffusion is outdiffused from the same locations as the body diffusion was earlier, these two diffusions are self-aligned. However, the same is not true of the deep body diffusions 120, since these (but not the source diffusion) are outdiffused from the notches in the source/body trench's sidewall. (See FIG. 3F.)

Step 10. Mask the poly and etch the poly contacts. (See FIG. 3G.) Note that there are no open trenches during this step: the gate trenches have remained full, and the source and drain trenches are still full of the N-type dopant source, and the short segments (or notches) which provide the trench for the deep body are still filled with the remaining portions of the P-type dopant source.

Step 11. Etch the N-doped layer completely out from both the source/body trench and the drain trench. (See FIG. 3H.)

Step 12. Etch the P-doped layer if it is a dielectric. (This layer may be left if it is an electrical conductor.) (See FIG. 3I.)

Step 13. Deposit the metal layer. Mask and etch it. This forms source contact metallization 108 and drain contact metallization 138. (See FIG. 3J.)

FIGS. 4A-4F show a variation on the process sequence of FIG. 3, in which step 14 has been changed. (Only process steps 13-16 are shown.)

Step 13. Mask the poly. Etch the poly contacts.

Step 14A. Etch the N-doped layer completely out of only the source/body trench.

Step 15. Etch the P-doped layer completely out of the source/body trench.

Step 16. Deposit the metal layer. Mask and etch it.

FIGS. 5A-5D shows another process sequence, which requires only ONE trench etch step. (Only process steps 0-6 are shown.)

Step 0. Starting material: N/N+ or n-type substrate.

Step 1. Etch the gate, the source/body, and the drain trenches.

Step 2. Form the gate oxide.

Step 3. Deposit the poly layer (Note that only the gate trench is filled by the poly deposition).

Step 4. Form a sacrificial layer that fills the other trenches.

Step 5. Mask and etch the sacrificial layer, the poly layer and the gate oxide layer in the unmasked regions.

Step 6. Deposit a P-doped layer (oxide, poly, silicon, etc.) to fill the source/body trenches, but not the drain trenches.

Further steps are e.g. as in the sequence of FIG. 3.

FIGS. 6A-6D show another alternative set of process steps, which can be combined with the process embodiment of FIGS. 3A-3J or others.

FIGS. 7A-7E show various Trench combinations for interdigitated Super 3D DMOS transistors:

a. Gate trenches separate, source/body and drain trenches continuous.

b. Gate trenches and source/body trenches separate, drain trenches continuous.

c. Gate trenches and drain trenches separate, source/body trenches continuous.

d. Gate trenches continuous, source/body trenches and drain trenches separate.

e. Gate trenches, source/body trenches, and drain trenches separate.

Figure 8B:
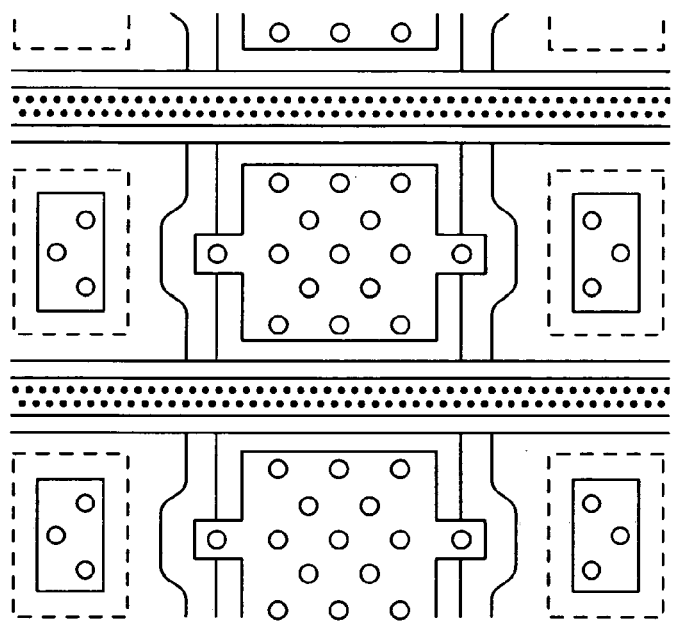
Figure 8C:
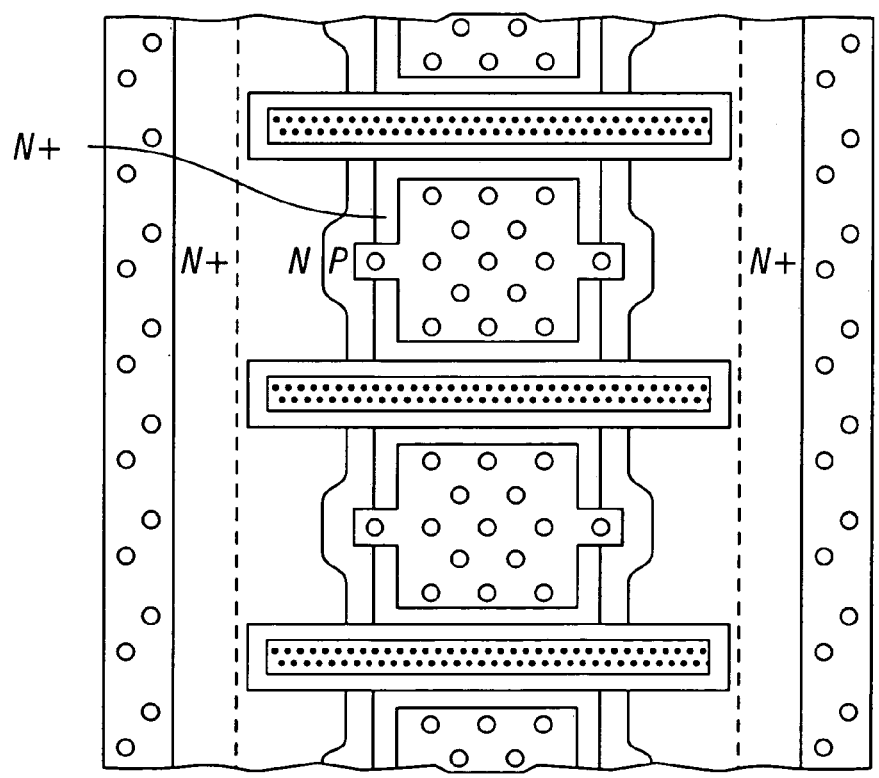

FIGS. 8A and 8B shows two examples of how breakdown voltage is increased by geometric modification in a continuous drain trench structure.

FIG. 8C shows an example of how breakdown voltage is increased by geometric modification in a Discontinuous drain trench structure. These modified "Super 3D" DMOS transistor structures, which differ from those of FIGS. 3 and 4 in that the breakdown voltage has been improved by moving the N+ drain region away from the gate. This shows how the structure is optimized for different operating voltages.

FIGS. 9A-9C show additional Super 3D DMOS transistor array geometries. Note that these array geometries provide very densely packed transistor structures, with an extremely high channel cross-section per unit surface area.

FIG. 9A shows a sample layout with square source and drain.

FIG. 9B shows a sample layout with Square source and square mesh drain.

FIG. 9C shows a sample layout with a Hexagonal source and hexagonal mesh drain.

FIGS. 10A-10C show additional variations on the Super 3D DMOS transistor geometries of FIGS. 9A-9C. Again, note that very dense packing is achieved. Optionally, as will be understood by power device designers, the geometric modifications shown in the drawings of FIGS. 9A-C can be combined with those shown in FIGS. 10A-C.

FIG. 10A shows a sample layout with Rectangular source and drain.

FIG. 10B shows a sample layout with Square mesh source and square drain.

FIG. 10C shows a sample layout. with Hexagonal mesh source and hexagonal drain.

Figure 1B:
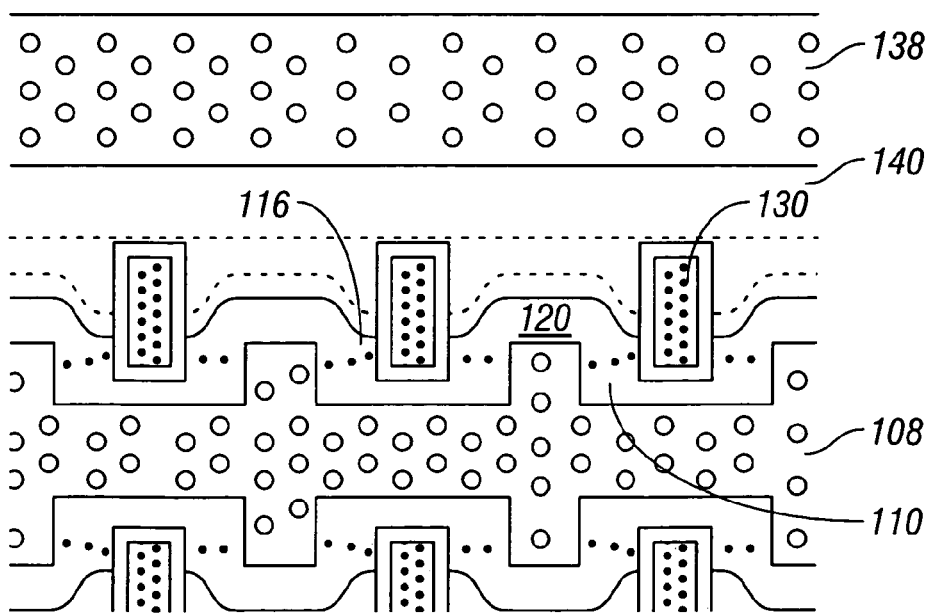
Figure 1C:
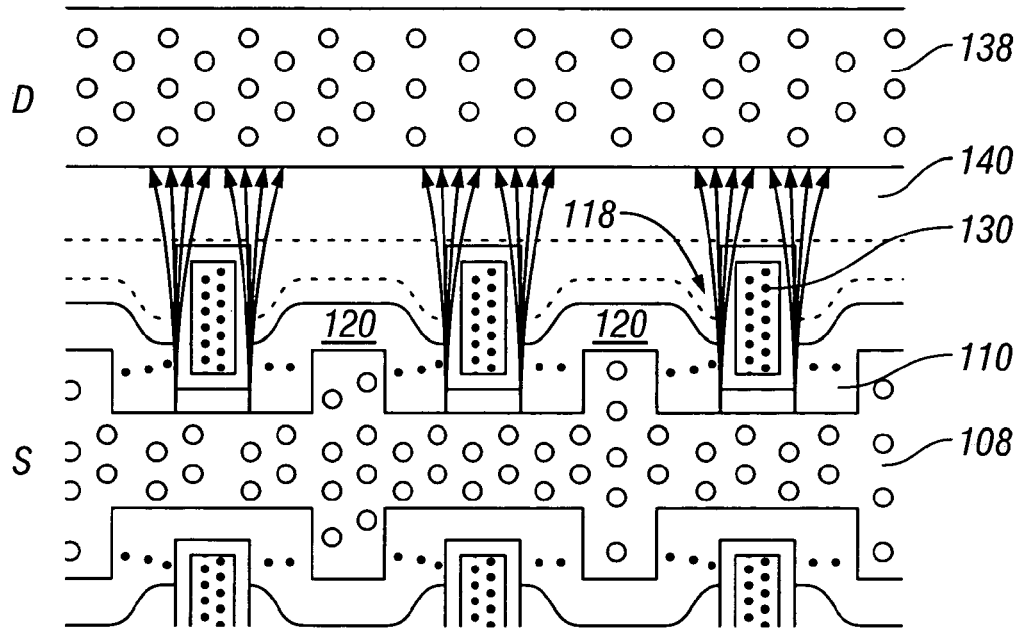

FIGS. 1A-1C show the solid-state physics of a device like the various families of FIGS. 3A-6D. FIG. 1A shows a section of a sample device embodiment, as fabricated by the process which leads up to FIG. 3J. This Figure is a sectional elevation of a downwardly extended lateral device, so not all of the relevant device structure is visible in this drawing; FIGS. 1B and 1C show a horizontal slice of the same device. Source diffusion 110, contacted by source metallization 108, is surrounded by a shallow body 116 (visible in FIG. 1B). Insulated gate 130 is capacitively coupled to control inversion of a channel region in the shallow body, to allow majority carriers to pass through (in the ON state) to the shallow drain (provided by the bulk semiconductor material0 and deep drain diffusions.

In this sample embodiment the source diffusion 110 is N-type, the body 116 and deep body 120 are P-type, and the drain diffusion 140 is N-type. Preferably the epitaxial material is also N-type, but more lightly doped than the source or drain diffusions.

FIG. 1C shows the carrier density, in a horizontal slice of such a device at some intermediate depth, in the "ON" state.

Figure 2A:
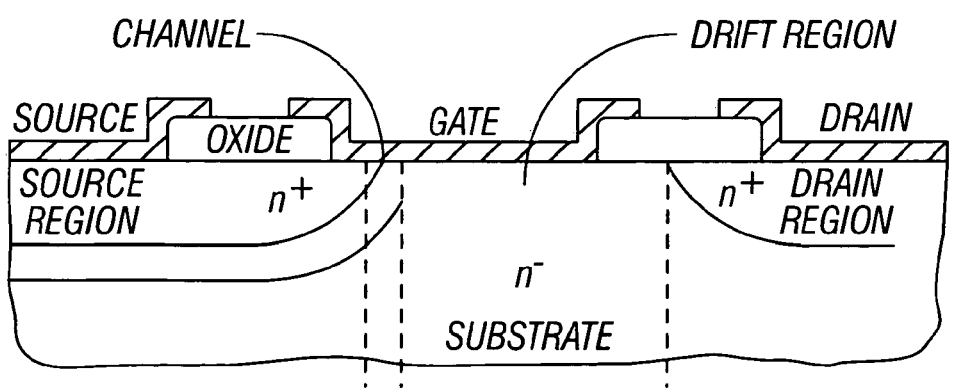
FIGS. 2A-2D respectively show known configurations of lateral DMOS, vertical DMOS, trench DMOS, and super-3D DMOS, respectively.
Figure 2B:
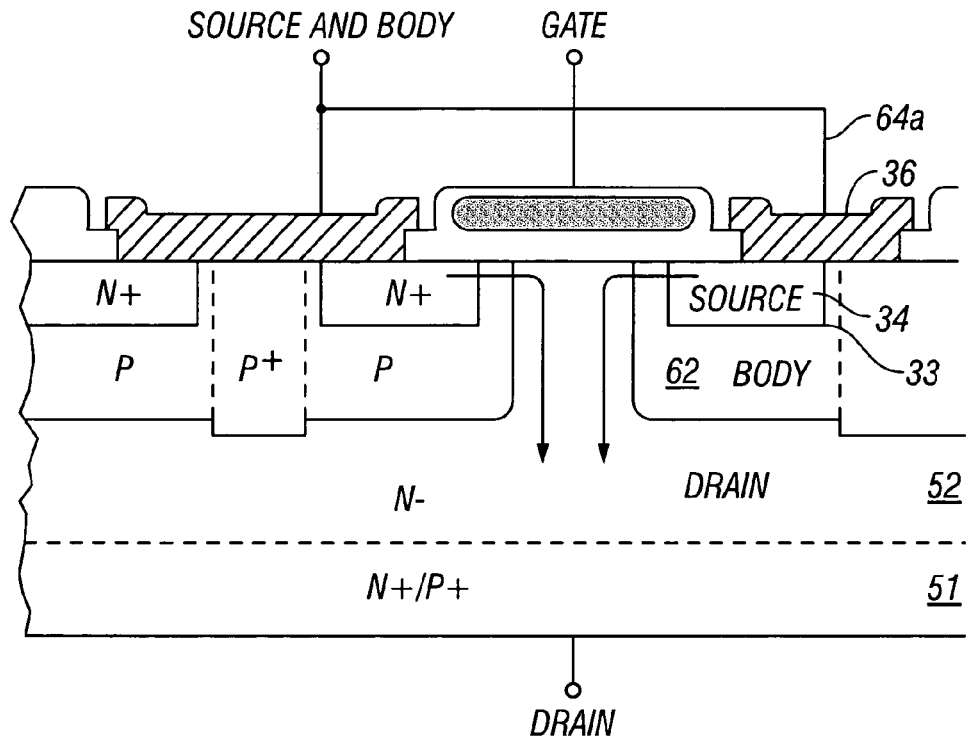
Figure 2C:
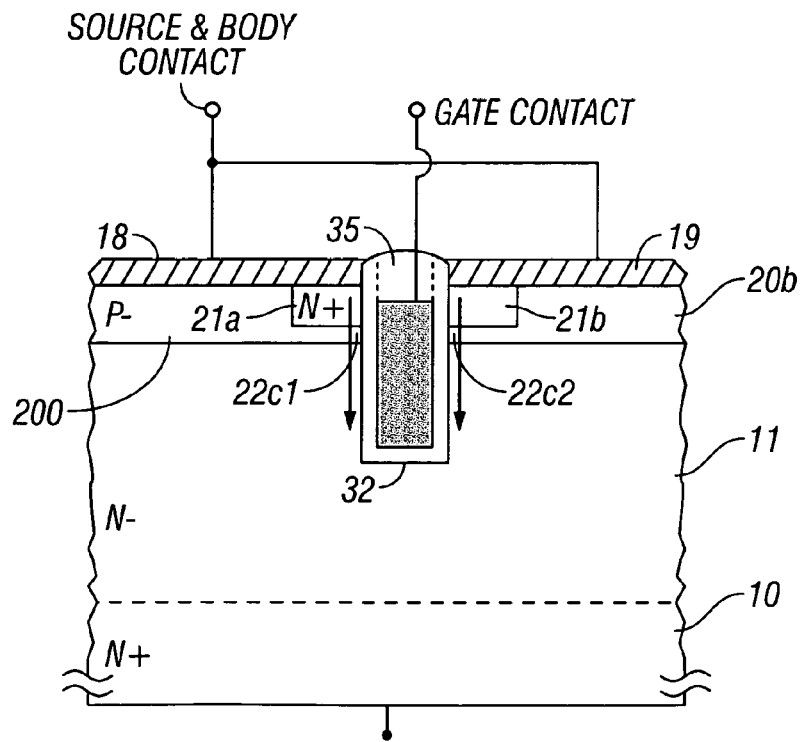
Figure 2D:
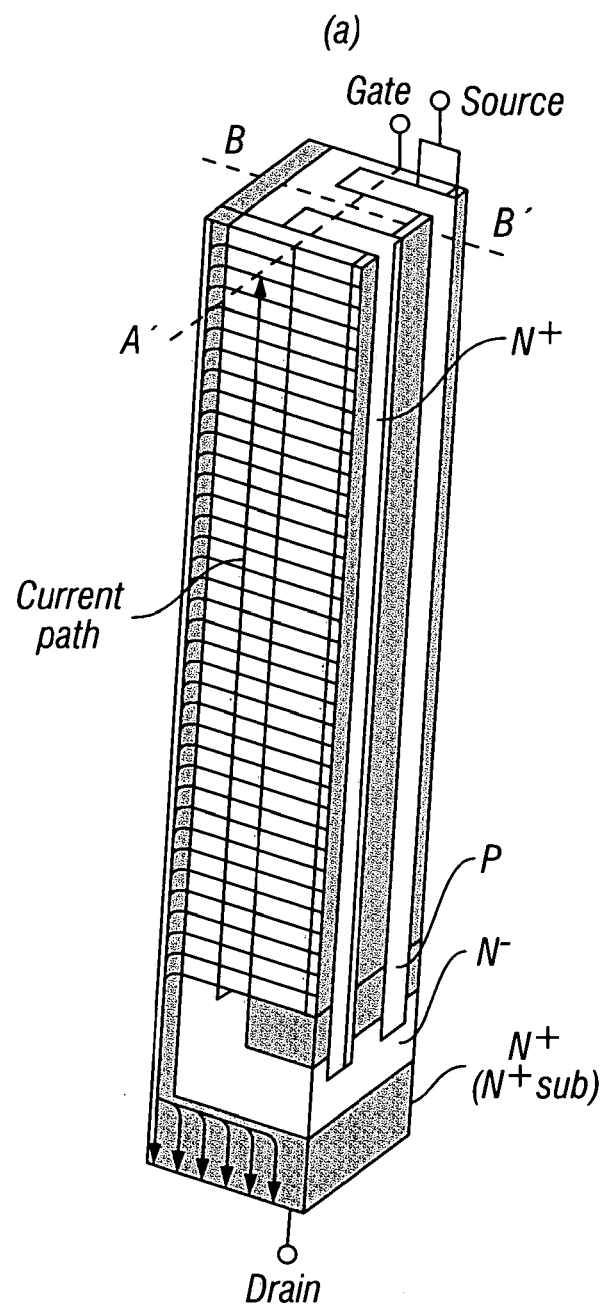

FIG. 1B shows how the depiction region spreads under reverse bias. As will be appreciated by those skilled in the art of power devices, the combination of these two figures illustrates a very important advantage of the disclosed devices over the Denso publications: FIG. 1B shows that the contour of the depletion region is partly determined by the deep body to shallow drain junction. This means that, as compared with devices like that of FIG. 2D, an additional depletion volume is present in the OFF state. Moreover, currents under breakdown conditions largely bypass the channel in favor of the deep body, which reduces the chances of device damage.

Following are some sample dimensions, in various sample embodiments. Of course, the dimensions actually chosen by device engineers, for a sample implementation, will be optimized in dependence on many factors, including not only process efficiency, but also the specifications of a particular application, and the criticality of different parameters.

a. Trench depth: 5-100 um
  b. Trench width: 0.5-5 um
  c. Distance of junction from trench wall:
    1) Source: 0.15-1 um
    2) Body, deep body: 0.25-1.0 um
    3) Drain: 0.25-2.5 um
  d. Deep body-to-drain: 2-20V: 1.0-3.0 um
    20-80V: 3.0-10 um
    80-300V: 10-25 um The present drawings show the gate trench as being closer to the drain trench than the deep body diffusion is. In an ideal device, the deep body diffusion is the same distance from the drain region as the gate trench or slightly closer.

Sample System Embodiments

The various classes of device structures and operating methods described above are believed to provide a uniquely low on-state impedance, for a given voltage rating and surface area. Low-power systems built around such devices can therefore achieve less power consumption and longer duration of functionality.

One class of such systems includes those which operate on a fixed energy budget, e.g. where the power source is a capacitor or small battery. In such cases the improvement of the system with the devices describe above means that switching operations can be designed into the basic sequencing of the system more freely, since the energy cost of each switch in the current path is less.

Another class of such systems includes those which operate on a fixed power budget, e.g. where the power source is a small solar array. Under power-limited conditions, the improvement of the system with the devices described above means that the system can stay in operation where this would not otherwise have been possible.

Another class of such systems includes those where the available power source has an inconveniently low voltage. In such cases, the improvement of the system with the devices described above means that voltage conversion or inversion stages can be designed in, where previously the ohmic losses on the input side would have been prohibitive.

In medical electronics, such systems achieve longer intervals between surgeries. This improved level of performance can save lives.

Another contemplated system embodiment is a complete power converter on-chip, using only a discrete inductor (and possibly capacitor) off-chip. In voltage-boosting applications, this can be implemented with a larger different drain spacing in the devices on the secondary side. In this instance, a transistor as described above is integrated on a single chip with other components.

Figure 13A:
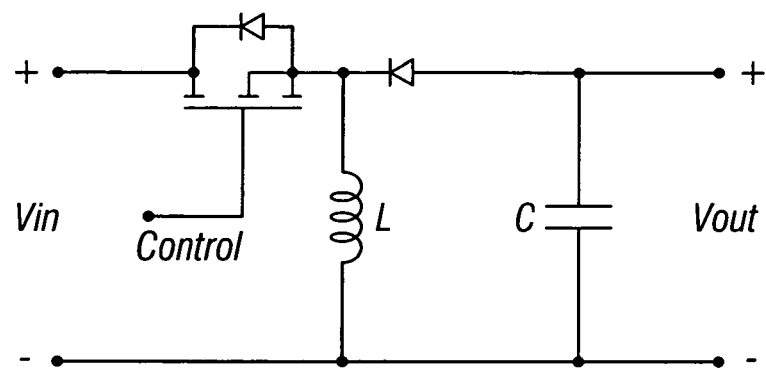
FIGS. 13A-13B show sample system embodiments.

FIG. 13A shows a sample system embodiment, in which a low-impedance switch as described above is used to improve the efficiency of a high-side driver in an automotive application.

Figure 13B:
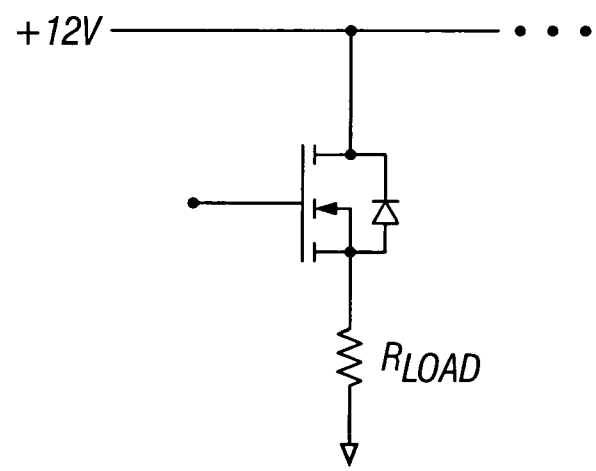

FIG. 13B shows another system embodiment, in which a boost converter, designed to run from a low-voltage supply, is integrated on a single chip (except for the discrete reactance).

These are just examples of the many cases where the power supply has inconveniently low power or energy or voltage constraints. In many cases, this can also mean that functional specifications can be met which would not otherwise have been feasible.

A wide variety of systems are improved in this way. This can include systems powered by batteries, temporarily powered by energy stored in a capacitor, solar powered, systems which steal power from data lines, and/or systems which obtain a power input from piezoelectrics, small solenoidal generators, or ambient RF fields.

According to various disclosed embodiments, there is provided: A three-dimensional active device structure, comprising: a downwardly extended source diffusion having a first conductivity type; a downwardly extended body diffusion having a second conductivity type, and laterally positioned adjacent to said source diffusion; a downwardly extended deep body diffusion having a second conductivity type, and laterally adjoining said body diffusion; a downwardly extended gate electrode, laterally positioned in proximity to at least part of said body diffusion and insulated therefrom; and a downwardly extended drain, positioned so that said body diffusion is laterally interposed between said drain and said source; wherein said source, body, deep body, gate and drain jointly define a respective DMOS-type device structure, at each of multiple different horizontal planes.

According to various disclosed embodiments, there is provided: A downwardly extended lateral-conduction device structure, comprising: a merged source/body trench, and source and deep body diffusions of opposite conductivity types adjacent to the walls thereof; wherein said trench is narrowed at locations where said source diffusions are present; a source contact conductor which extends into said merged trench, and makes contact with said source and deep body diffusions; a gate trench, containing conductive material which is capacitively coupled to said body diffusion; and a downwardly extended drain diffusion, laterally spaced to receive charge carriers from said source diffusion under at least some conditions.

According to various disclosed embodiments, there is provided: A multi-trench device structure, comprising: a first trench comprising two merged portions: a first substantially continuous portion, and a second portion comprising multiple separated short trench segments which run into said first portion; a first-type source diffusion adjacent to the walls of said first trench, and a second-type body diffusion which surrounds said source diffusion; a second-type deep-body diffusion which laterally adjoins said trench segments; a second trench, containing conductive material which is positioned in lateral proximity to said body diffusion; and a downwardly extended drain diffusion, adjacent to a third trench, and laterally spaced to receive charge carriers from said source diffusion under at least some conditions.

According to various disclosed embodiments, there is provided: A method for building a downwardly-extended horizontal-conduction active device, comprising the actions of: a) etching a substantially vertical gate trench into a semiconductor layer, forming an insulated gate electrode therein, and leaving said gate electrode in place during all subsequent process steps; b) forming downwardly extended source regions which are aligned to substantially vertical source trenches; c) forming downwardly extended body regions which are self-aligned to said source regions; d) forming downwardly extended source regions which are aligned to substantially vertical drain trenches; wherein said downwardly extended source, body, gate, and drain regions, at various depths, jointly define a DMOS-type transistor which provides controllable lateral current flow.

According to various disclosed embodiments, there is provided: A method for making a multi-trench device structure, comprising the actions of, at various times: etching first, additional, second, and third trenches into a semiconductor material, and doping walls of said trenches so that doped walls of said first trenches define source regions, doped walls of said additional trenches define deep body regions, said second trenches define gate regions, and doped walls of said third trenches define drain regions; wherein said source, body, deep body, gate, and drain regions, at various depths, jointly define a DMOS-type transistor which provides controllable lateral current flow; and patterning and etching thin-film conductors to thereby provide a complete operative device; wherein substantially all of said patterning steps are performed with all etched trenches filled, and wherein at least some of said trenches are filled with a dopant source or conductor during at least some said patterning steps.

According to various disclosed embodiments, there is provided: A method for making a multi-trench device structure, comprising the actions of, at various times: etching multiple trenches into a semiconductor material, and doping various walls of said trenches variously, so that various diffusions adjacent various said trenches define downwardly extending source, body, deep body, and drain regions; and fabricating a downwardly extending gate electrode which is capacitively coupled to said boy regions; patterning and etching thin-film conductors to provide a complete operative device, in which said source, body, deep body, gate, and drain regions, at various depths, jointly define a DMOS-type transistor which provides controllable lateral current flow; and filling all open ones of said trenches, at least temporarily, during each said patterning operation.

According to various disclosed embodiments, there is provided: A method for building a downwardly-extended horizontal-conduction active device, comprising the actions of, at various times: etching a plurality of source trenches and a plurality of drain trenches simultaneously; forming downwardly extended source regions of a first conductivity type on the walls of said source trenches, and forming downwardly extended body regions of a second conductivity type which are self-aligned to said source regions; etching a plurality of gate trenches which are separated from said source regions by said body and deep body diffusions, and forming downwardly extended gate electrodes in or around said gate trenches; and forming downwardly extended drain structures in or around said drain trenches; wherein said downwardly extended source, body, gate, and drain regions, at various depths, jointly define a DMOS-type transistor which provides controllable lateral current flow.

According to various disclosed embodiments, there is provided: A method for building a downwardly-extended horizontal-conduction active device, comprising the actions of, at various times: etching a plurality of first trenches and a plurality of second trenches simultaneously, wherein said first trenches have notches in the walls thereof, and wherein said first trenches have a minimum width which is less than the minimum width of said second trenches; forming downwardly extended source regions of a first conductivity type on the walls of said first trenches, forming downwardly extended body regions of a second conductivity type which are self-aligned to said source regions, and forming downwardly extended deep body regions of said second conductivity type which are self-aligned to said notches; etching a plurality of third trenches which are separated from said source regions by said body and deep body diffusions, and forming downwardly extended gate electrodes in or around said third trenches; and forming downwardly extended drain structures in said second trenches; wherein said downwardly extended source, body, deep body, gate, and drain regions, at various depths, jointly define a DMOS-type transistor which provides controllable lateral current flow.

According to various disclosed embodiments, there is provided: A method for building a downwardly-extended horizontal-conduction active device, comprising the actions of, at various times: a) etching, into a semiconductor material, a plurality of first trenches having substantially vertical sidewalls, and etching lateral notches, which also have substantially vertical sidewalls, into said sidewalls of said first trenches; b) laterally diffusing a second-type dopant from said sidewalls of said first trenches, to form a downwardly extended body region; c) laterally diffusing a first-type dopant from said sidewalls of said first trenches to form a downwardly extended source diffusion inside said shallow body region, while simultaneously diffusing an additional dose of second-type dopant from said sidewalls of said notches to form a downwardly extended deep-body region; d) forming a plurality of downwardly extended gate electrodes, which are each capacitively coupled to at least some portion of said body region; and e) forming a plurality of downwardly extended drain diffusions; wherein said downwardly extended source, body, deep body, gate, and drain regions, at each of various depths, jointly define a DMOS-type transistor which provides controllable lateral current flow.

According to various disclosed embodiments, there is provided: An array of device structures as above.

According to various disclosed embodiments, there is provided: A method for operating a MOS-gated downwardly-extended lateral current device, comprising the actions of: in a first condition, biasing a downwardly-extended gate electrode to control the carrier concentration in a downwardly-extended channel/shallow-body diffusion which laterally abuts a downwardly-extended source diffusion, and to thereby permit majority carrier transport out of said source diffusion through said channel to a downwardly-extended drain diffusion; and in a second condition, assisting depletion of carriers from around said channel, by also depleting from a deep body which extends laterally, from the vicinity of said source diffusion toward said drain diffusion, farther than does said shallow-body diffusion; whereby any breakdown currents which may appear will flow predominantly through said deep-body diffusion rather than said channel.

According to various disclosed embodiments, there is provided: A system comprising: a power source having limited voltage, power, and/or energy; a load element, which is operatively connected to said power source through at least one electronic switch; wherein said switch comprises a three-dimensional active device structure, comprising: a downwardly extended source diffusion having a first conductivity type; a downwardly extended body diffusion having a second conductivity type, and laterally positioned adjacent to said source diffusion; a downwardly extended deep body diffusion having a second conductivity type, and laterally adjoining said body diffusion; a downwardly extended gate electrode, laterally positioned in proximity to at least part of said body diffusion and insulated therefrom; and a downwardly extended drain, positioned so that said body diffusion is laterally interposed between said drain and said source; wherein said source, body, deep body, gate and drain jointly define a respective DMOS-type device structure, at each of multiple different horizontal planes.

According to various disclosed embodiments, there is provided: A system comprising: a power source having limited voltage, power, and/or energy; and a load element, which is operatively connected to said power source through at least one electronic switch; wherein said switch comprises a downwardly extended lateral-conduction device structure, comprising: a merged source/body trench, and source and deep body diffusions of opposite conductivity types adjacent to the walls thereof; wherein said trench is narrowed at locations where said source diffusions are present; a source contact conductor which extends into said merged trench, and makes contact with said source and deep body diffusions; a gate trench, containing conductive material which is capacitively coupled to said body diffusion; and a downwardly extended drain diffusion, laterally spaced to receive charge carriers from said source diffusion under at least some conditions.

According to various disclosed embodiments, there is provided: A DMOS transistor which is fabricated with its source/body/deep body regions formed on the walls of a first set of trenches, and its drain regions formed on the walls of a second set of trenches. A gate region which is formed in a third set of trenches can be biased to allow carriers to flow from the source to the drain. Lateral current low from source/body regions on trench walls increases the active channel perimeter to a value well above the amount that would be present if the device was fabricated on just the surface of the wafer. A transistor with a very low on-resistance per unit area is obtained.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For example, as noted above, the structure can be modified for a particular operating voltage range. A wide variety of array geometries are also possible.

For another example, the substrate can be silicon, silicon-germanium, silicon-germanium-carbide, or other indirect- or direct-bandgap elemental or compound or alloyed semiconductors. However, silicon is believed to be particularly advantageous at present, due to the mature technology of deep trench etching and trench sidewall treatment, which is well known to silicon power device technologists.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS.

The claims as filed are intended to be as comprehensive as possible, and NO subject matter is intentionally relinquished, dedicated, or abandoned.

What is claimed is:

1. A three-dimensional active device structure, comprising:
    a downwardly extended source diffusion having a first conductivity type;
    a downwardly extended body diffusion having a second conductivity type, and laterally positioned to the source diffusion;
    a downwardly extended deep body diffusion having a second conductivity type, and laterally adjoining the body diffusion;
    a downwardly extended gate electrode, laterally positioned in proximity to at least part of the body diffusion and insulated from the body diffusion;
    a downwardly extended drain, positioned so that the body diffusion is laterally positioned between the drain and the source diffusion;
    wherein the source diffusion, body diffusion, deep body diffusion, gate, and drain jointly define a DMOS-type device structure at a horizontal plane; and
    wherein the structure has predominately horizontal current flow at the horizontal plane.

2. The structure of claim 1, further comprising a conductor that electrically contacts the drain.

3. The structure of claim 1, further comprising a vertical-walled downwardly-extending trench that is filled with a doped semiconductor material that electrically contacts the drain.

4. The structure of claim 1, wherein the source diffusion, body diffusion, and deep body diffusion consist essentially of a dopant in silicon.

5. The structure of claim 1, wherein the first conductivity type is N-type.

6. The structure of claim 1, wherein the source diffusion and body diffusion are both laterally outdiffused from a single trench.

7. The structure of claim 1, wherein the gate electrode is laterally surrounded by an insulator.

8. The structure of claim 1, wherein at least one of the gate electrode and the drain is formed in a trench that has a depth that is at least 10 times a minimum width of the trench.

9. A three-dimensional active device structure, comprising:
    a merged source and body trench;
    a downwardly extended source diffusion of a first conductivity type adjacent to walls of the merged source and body trench;
    a downwardly extended deep body diffusion of a second conductivity type adjacent to the walls of the merged source and body trench, the second conductivity type opposite the first conductivity type;
    a source contact conductor that contacts the source diffusion and deep body diffusion and extends into the merged source and body trench;
    a gate trench containing conductive material, the conductive material is capacitively coupled to the deep body diffusion; and
    a downwardly extended drain diffusion laterally spaced from the gate trench so as to allow charge carriers from the source diffusion to flow to the drain diffusion under at least some conditions.

10. The structure of claim 9, wherein the merged source and body trench is narrowed at locations where the source diffusion is present.

11. The structure of claim 9, further comprising a conductor that electrically contacts the drain diffusion.

12. The structure of claim 9, further comprising a vertical-walled downwardly-extending trench, filled with a doped semiconductor material that electrically contacts the drain diffusion.

13. The structure of claim 9, wherein the source diffusion and deep body diffusion consist essentially of a dopant in silicon.

14. The structure of claim 9, wherein the first conductivity type is N-type.

15. The structure of claim 9, wherein the source diffusion is laterally surrounded by a body diffusion of the second conductivity type.

16. A three-dimensional active device structure, comprising:
- a downwardly extended source diffusion consisting essentially of an N-type dopant in silicon, the source diffusion laterally outdiffused from a first trench;
- a downwardly extended body diffusion having a second conductivity type, laterally positioned to the source diffusion, consisting essentially of a dopant in silicon, and laterally outdiffused from the first trench;
- a downwardly extended deep body diffusion having a second conductivity type, consisting essentially of a dopant in silicon, and laterally adjoining the body diffusion;
- a downwardly extended gate electrode, laterally positioned in proximity to at least part of the body diffusion, and laterally surrounded by an insulator so as to insulate the gate electrode from the body diffusion;
- a downwardly extended drain, positioned so that the body diffusion is laterally positioned between the drain and the source diffusion;
- a vertical-walled downwardly-extending trench that is filled with a doped semiconductor material that electrically contacts the drain; and
- wherein at least one of the gate electrode and the drain is formed in a second trench that has a depth that is at least 10 times a minimum width of the second trench.

17. The structure of claim 16, wherein the source diffusion, body diffusion, deep body diffusion, gate, and drain jointly define a DMOS-type device structure at a horizontal plane.

18. The structure of claim 17, wherein the structure has predominately horizontal current flow at the horizontal plane.

* * * * *